(12) United States Patent
Lee et al.

(10) Patent No.: US 8,223,281 B2
(45) Date of Patent: Jul. 17, 2012

(54) ARRAY SUBSTRATE FOR LIQUID CRYSTAL DISPLAY DEVICE AND METHOD OF MANUFACTURING THE SAME

(75) Inventors: Jung-Eun Lee, Seoul (KR); Jae-Kyun Lee, Gunpo-si (KR); Moo-Hyoung Song, Daegu (KR); Seung-Chan Choi, Gyeongsan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/238,987

(22) Filed: Sep. 21, 2011

(65) Prior Publication Data

US 2012/0008072 A1 Jan. 12, 2012

Related U.S. Application Data

(62) Division of application No. 11/639,902, filed on Dec. 15, 2006, now Pat. No. 8,040,445.

(30) Foreign Application Priority Data

Apr. 18, 2006 (KR) .............................. 2006-0034847

(51) Int. Cl.
*G02F 1/1343* (2006.01)
(52) U.S. Cl. ........................................................ 349/38
(58) Field of Classification Search ................. 349/38
See application file for complete search history.

(56) References Cited

U.S. PATENT DOCUMENTS

| 2004/0169812 A1 | 9/2004 | Kim |
| 2004/0252263 A1 | 12/2004 | Yang et al. |
| 2005/0099569 A1 | 5/2005 | Moon et al. |
| 2005/0280763 A1 | 12/2005 | Kang et al. |
| 2006/0001803 A1 | 1/2006 | Park |
| 2006/0001814 A1 | 1/2006 | Paik et al. |
| 2006/0227276 A1 | 10/2006 | Son |

FOREIGN PATENT DOCUMENTS

| CN | 1577829 | 2/2005 |
| CN | 1664683 | 9/2005 |
| JP | 2004-199074 | 7/2004 |

OTHER PUBLICATIONS

Office Action for corresponding United Kingdom Patent Application Serial No. 0624956.9.
Office Action issued in corresponding Japanese Patent Application No. 2006-345416; mailed Jul. 26, 2010.
Office Action issued in corresponding Chinese Patent Application No. 200610168054.4; issued Aug. 29, 2008.
Office Action issued in corresponding German Patent Application No. 10-2006-0570773.6-33; issued Jan. 29, 2009.

*Primary Examiner* — Timothy L Rude
(74) *Attorney, Agent, or Firm* — Brinks Hofer Gilson & Lione

(57) ABSTRACT

An array substrate for an in-plane switching mode liquid crystal display device includes a substrate, a gate line disposed along a first direction on the substrate, a data line disposed along a second direction and crossing the gate line to define a pixel region, a thin film transistor connected to the gate line and the data line, pixel electrodes disposed in the pixel region and connected to the thin film transistor, common electrodes disposed in the pixel region and alternating with the pixel electrodes, a semiconductor layer underlying the data line and including a portion having a width greater than a width of the data line, and a first blocking pattern comprising an opaque material and disposed under the semiconductor layer.

5 Claims, 22 Drawing Sheets

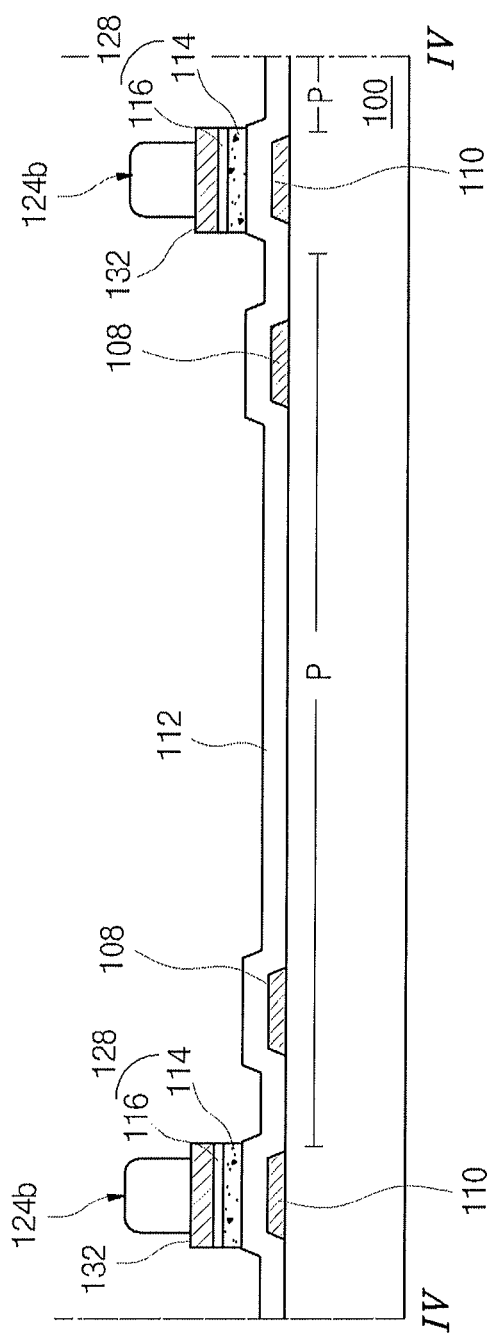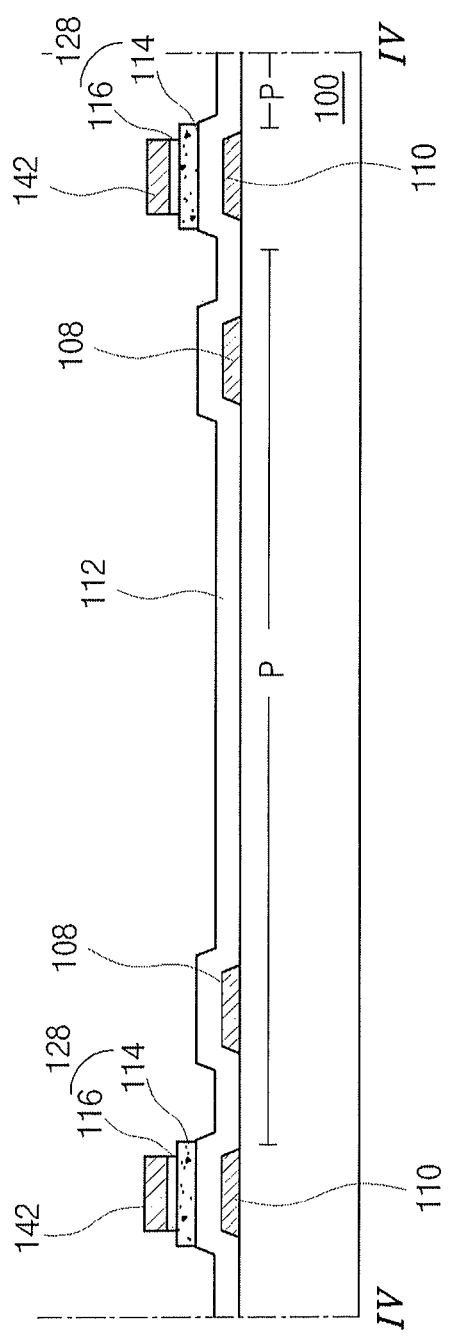
FIG. 6E
FIG. 6F

ARRAY SUBSTRATE FOR LIQUID CRYSTAL DISPLAY DEVICE AND METHOD OF MANUFACTURING THE SAME

RELATED APPLICATIONS

The present patent document is a divisional of U.S. patent application Ser. No. 11/639,902, filed Dec. 15, 2006, which claims priority to Korean Patent Application No. 2006-0034847 filed in Korea on Apr. 18, 2006, which is hereby incorporated by reference.

BACKGROUND

1. Field of the Invention

The present disclosure relates to a liquid crystal display device, and more particularly, to an array substrate for a liquid crystal display (LCD) device and a method of manufacturing the same.

2. Description of the Related Art

Liquid crystal display ("LCD") devices are driven based on electro-optical characteristics of a liquid crystal material. The liquid crystal material has an intermediate state between a solid crystal and an isotropic liquid. The liquid crystal material is fluid like the isotropic liquid, and molecules of the liquid crystal material are regularly arranged like the solid crystal. An alignment direction of the liquid crystal molecules depends on the intensity or the direction of an electric field applied to the liquid crystal molecules. Light passes through the LCD device along the alignment direction of the liquid crystal molecules. By controlling the intensity or the direction of the electric field, the alignment direction of the liquid crystal molecules may be altered, and images may be displayed.

Active matrix liquid crystal display ("AMLCD") devices, which include thin film transistors as switching devices for a plurality of pixels, have been widely used due to their high resolution and ability to display fast moving images.

Generally, an LCD device includes two substrates, which are spaced apart and facing each other, and a liquid crystal layer interposed between the two substrates. Each of the substrates includes an electrode. The electrodes from respective substrates face one another. An electric field is induced between the electrodes by applying a voltage to each electrode. An alignment direction of liquid crystal molecules changes in accordance with a variation in the intensity or the direction of the electric field. The direction of the electric field is perpendicular to the substrates. The LCD device has relatively high transmittance and a large aperture ratio.

However, the LCD device may have narrow viewing angles. To increase the viewing angles, various modes have been proposed. Among these modes, an in-plane switching (IPS) mode of the related art will be described with reference to accompanying drawings.

FIG. 1 is a schematic cross-sectional view of an IPS mode LCD device according to a first embodiment of the related art.

In FIG. 1, the IPS mode LCD device according to the first embodiment of the related art includes a lower substrate 10 and an upper substrate 40, and a liquid crystal layer LC is interposed between the lower substrate 10 and the upper substrate 40.

A thin film transistor T, common electrodes 30 and pixel electrodes 32 are formed at each pixel P on the lower substrate 10. The thin film transistor T includes a gate electrode 12, a semiconductor layer 16, and source and drain electrodes 20 and 22. The semiconductor layer 16 is disposed over the gate electrode 12 with a gate insulating layer 14 therebetween. The semiconductor layer 16 includes an active layer 16a and an ohmic contact layer 16b. The source and drain electrodes 20 and 22 are formed on the semiconductor layer 16 and are spaced apart from each other.

Although not shown in the figure, a gate line is formed along a first side of the pixel P, and a data line is formed along a second side of the pixel P perpendicular to the first side. A common line is further formed on the lower substrate 10. The common line provides the common electrodes 30 with voltage.

A black matrix 42 and a color filter layer 44 are formed on an inner surface of the upper substrate 40. The black matrix 42 is disposed over the gate line, the data line and the thin film transistor T. The color filter layer 44 is disposed at the pixel P.

Liquid crystal molecules of the liquid crystal layer LC are driven by a horizontal electric field 50 induced between the common electrodes 30 and the pixel electrodes 32.

The lower substrate 10, including the thin film transistor T, the common electrodes 30 and the pixel electrodes 32, may be referred to as an array substrate. The upper substrate 40, including the black matrix 42 and the color filter layer 44, may be referred to as a color filter substrate.

The array substrate may be manufactured through 5 mask processes. That is, the gate electrode and the gate line are formed through a first mask process. The semiconductor layer, including the active layer and the ohmic contact layer, is formed through a second mask process. The source and drain electrodes and the data line are formed through a third mask process. A passivation layer and a contact hole are formed through a fourth mask process. The common electrodes and the pixel electrodes are formed through a fifth mask process.

In the IPS mode LCD device, the common electrodes 30 and the pixel electrodes 32 are formed on the same substrate 10. A large amount of light from a light source (not shown) is blocked due to the electrodes 30 and 32. Accordingly, the IPS mode LCD device has relatively low brightness.

To increase the brightness, the common electrodes 30 and the pixel electrodes 32 have been formed of a transparent conductive material. Even though the electrodes are transparent, light is not transmitted entirely through the electrodes. That is, some areas of the electrodes under the electric field induced between the electrodes can be used for an aperture ratio. However, the brightness of the IPS mode LCD device is generally increased on the whole when the electrodes are formed of a transparent conductive material.

Meanwhile, the mask process includes many steps of coating a thin film with photoresist, exposing the photoresist to light, developing the photoresist, etching the thin film, and removing the photoresist. Therefore, 4 mask processes for the IPS mode LCD device have been proposed to decrease the manufacturing costs and time. By using a half tone or slit mask, the active layer and the source and drain electrodes are formed through the same mask process.

An IPS mode LCD device including an array substrate, which is manufactured through 4 mask processes in the related art, will be described hereinafter with reference to the attached drawing.

FIG. 2 is a cross-sectional view of an IPS mode LCD device including an array substrate according to a second embodiment of the related art.

In FIG. 2, the IPS mode LCD device includes a lower substrate 50 and an upper substrate 80, which are spaced apart from each other. The IPS mode LCD device further includes a liquid crystal layer LC interposed between the lower and upper substrates 50 and 80.

A thin film transistor T, pixel electrodes 70 and common electrodes 72 are formed at each pixel P on the lower substrate 50. The thin film transistor T includes a gate electrode 52, a semiconductor layer 56, and source and drain electrodes 62 and 64. The semiconductor layer 56 is disposed over the gate electrode 52 with a gate insulating layer 54 therebetween. The semiconductor layer 56 includes an active layer 56a and an ohmic contact layer 56b. The source and drain electrodes 62 and 64 are formed on the semiconductor layer 56 and are spaced apart from each other. The common electrodes 72 and the pixel electrodes 70 are formed of a transparent conductive material, for example, indium tin oxide (ITO).

Although not shown in the figure, a gate line (not shown) is formed along a first side of the pixel P, and a data line 66 is formed along a second side of the pixel P perpendicular to the first side. A common line (not shown) is further formed on the lower substrate 50. The common line provides the common electrodes 72 with voltage. Another semiconductor layer 58 is formed under the data line 66.

A black matrix 82 and a color filter layer 84 are formed on an inner surface of the upper substrate 80. The black matrix 82 is disposed over the gate line (not shown), the data line 66 and the thin film transistor T. The color filter layer 84 is disposed at the pixel P.

Here, the semiconductor layers 56 and 58 are partially exposed at sides of each of the source and drain electrodes 62 and 64 and the data line 66. When light from a light source is irradiated to the IPS mode LCD device including the above-mentioned structure, hydrogen atoms in the semiconductor layers 56 and 58 are excited due to the light, and currents may occur. The currents change according to a dimming frequency of the light source, and a coupling capacitance may be formed due to signal interference between the data line 66 and the common and pixel electrodes 72 and 70 adjacent to the data line 66. The coupling capacitance may cause a wavy noise in the displayed image.

More particularly, a backlight is disposed at a rear side of an LC panel of an LCD device. The backlight is driven depending on a dimming frequency to obtain a clear contrast between brightness and darkness. The backlight operates very fast according to low and high states of the frequency. According to this, light from the backlight is irradiated to the LC panel slightly differently, and the semiconductor layer acts like on and off modes. There is a potential difference between the adjacent data line and common electrode due to this characteristic of the active layer, and a wavy noise occurs on displayed images of the LC panel. The wavy noise decreases the quality of the LCD device. The wavy noise shows in the LCD device including an array substrate which is manufactured through 4 mask processes.

BRIEF SUMMARY

Accordingly, the present embodiments are directed to a liquid crystal display device that may substantially obviate one or more problems due to limitations and disadvantages of the related art. Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In a first aspect, an array substrate for an in-plane switching mode liquid crystal display device includes a substrate, a gate line disposed along a first direction on the substrate, and a data line disposed along a second direction. The data line crosses the gate line to define a pixel region, and a thin film transistor is connected to the gate line and the data line. Pixel electrodes are disposed in the pixel region and connected to the thin film transistor. Common electrodes are also disposed in the pixel region and alternate with the pixel electrodes. A semiconductor layer is disposed under the data line and includes a portion having a width greater than a width of the data line, and a first blocking pattern comprising an opaque material is disposed under the semiconductor layer.

In a second aspect, an array substrate for an in-plane switching mode liquid crystal display device includes a substrate, a gate line disposed on the substrate, and a data line crossing the gate line to define a pixel region. A thin film transistor is connected to the gate line and the data line. Pixel electrodes are disposed in the pixel region and connected to the thin film transistor. Common electrodes are also disposed in the pixel region and alternate with the pixel electrodes. A semiconductor layer is disposed under the data line and includes a portion having a width greater than a width of the data line, and a first blocking pattern is disposed over the data line and substantially covers the semiconductor layer.

In a third aspect, an in-plane switching mode liquid crystal display device includes first and second substrates spaced apart from each other with a liquid crystal material disposed between the substrates. A gate line is disposed on an inner surface of the first substrate, and a data line crosses the gate line to define a pixel region. A thin film transistor contacts the gate line and the data line. Pixel electrodes are disposed in the pixel region and connected to the thin film transistor. Common electrodes are also disposed in the pixel region and alternate with the pixel electrodes. A semiconductor layer is disposed under the data line and includes a portion having a width greater than a width of the data line, and a blocking pattern comprising an opaque material is disposed under the semiconductor layer. A black matrix is disposed on an inner surface of the second substrate, and a color filter layer is disposed on the inner surface of the second substrate.

In a fourth aspect, an in-plane switching mode liquid crystal display device includes first and second substrates spaced apart from each other with a liquid crystal material disposed between the substrates. A gate line is disposed on an inner surface of the first substrate, and a data line crosses the gate line to define a pixel region. A thin film transistor is connected to the gate line and the data line. Pixel electrodes are disposed in the pixel region and connected to the thin film transistor, and common electrodes are also disposed in the pixel region and alternate with the pixel electrodes. A semiconductor layer underlies the data line and includes a portion having a width greater than a width of the data line. A first blocking pattern comprises an opaque material and is disposed under the semiconductor layer. A second blocking pattern is disposed over the data line and substantially covers the semiconductor layer. A black matrix is disposed on an inner surface of the second substrate, and a color filter layer is disposed on the inner surface of the second substrate.

In a fifth aspect, a method of manufacturing an array substrate for an in-plane switching mode liquid crystal display device includes forming a gate line, a gate electrode, and a first blocking pattern on a substrate through a first mask process. A gate insulating layer, an intrinsic silicon layer, an impurity-doped silicon layer, and a conductive material layer are formed on the substrate including the gate line, the gate electrode and the first blocking pattern. A first semiconductor layer, a source electrode, a drain electrode, a data line, and a second semiconductor layer are formed by patterning the conductive material layer, the impurity-doped silicon layer, and the intrinsic silicon layer through a second mask process.

The data line crosses the gate line to define a pixel region and overlies the second semiconductor layer. The second semiconductor layer includes a portion having a width greater than a width of the data line and is disposed over the first blocking pattern. A passivation layer is formed having a first contact hole exposing the drain electrode through a third mask process. Pixel electrodes and common electrodes are formed through a fourth mask process, such that the pixel electrodes contact the drain electrode through the first contact hole and alternate with the common electrodes.

In a sixth aspect, a method of manufacturing an array substrate for an in-plane switching mode liquid crystal display device includes forming a gate line and a gate electrode on a substrate through a first mask process. A gate insulating layer, an intrinsic silicon layer, an impurity-doped silicon layer, and a conductive material layer are formed on the substrate including the gate line and the gate electrode. A first semiconductor layer, a source electrode, a drain electrode, a data line, and a second semiconductor layer are formed by patterning the conductive material layer, the impurity-doped amorphous silicon layer, and the intrinsic amorphous silicon layer through a second mask process. The patterning comprises partially exposing the second semiconductor layer at both sides of the data line. A passivation layer having a first contact hole and a second contact hole is formed through a third mask process. The first contact hole exposes the drain electrode, and the second contact hole exposes the data line. Pixel electrodes, common electrodes and a first blocking pattern are formed through a fourth mask process, such that the pixel electrodes contact the drain electrode through the first contact hole and alternate with the common electrodes. The first blocking pattern contacts the data line and overlies the second semiconductor layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this specification, illustrate embodiments of the disclosure and together with the description serve to explain the principles of the disclosure. In the drawings:

FIGS. 5A to 5H and FIGS. 6A to 6H are cross-sectional views of an array substrate for an IPS mode LCD device in processes of manufacturing the same;

DETAILED DESCRIPTION OF THE DRAWINGS AND THE PRESENTLY PREFERRED EMBODIMENTS

Reference will now be made in detail to the embodiments of the present disclosure, examples of which are illustrated in the accompanying drawings.

Figure 1:
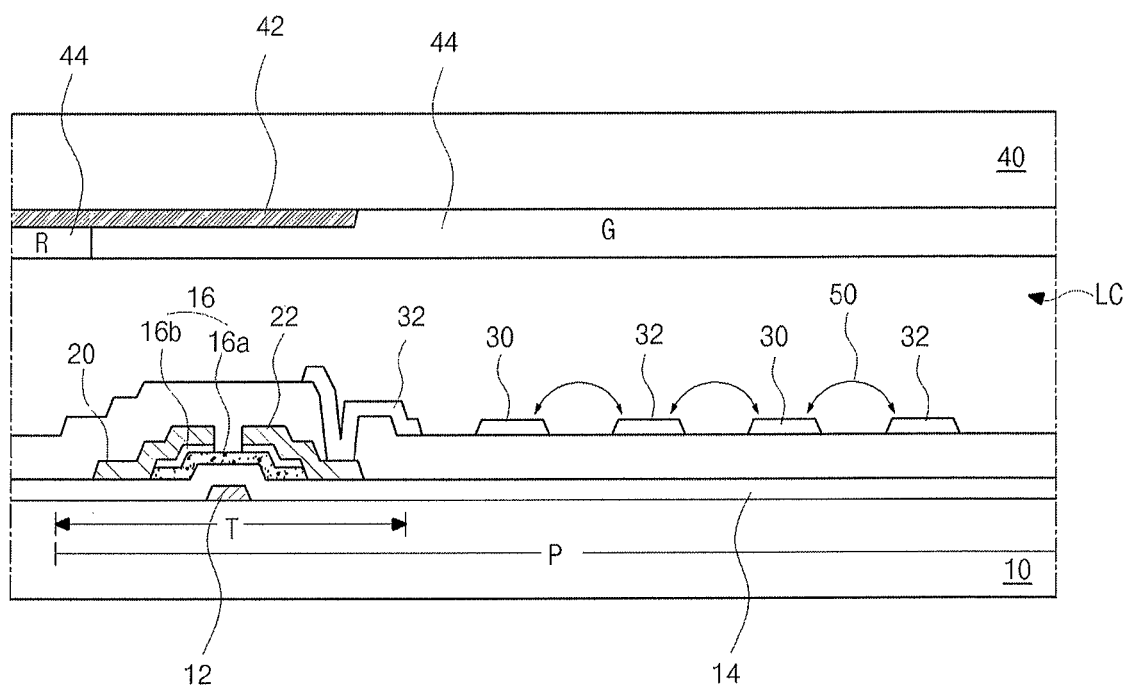
FIG. 1 is a schematic cross-sectional view of an IPS mode LCD device according to a first embodiment of the related art.
Figure 2:
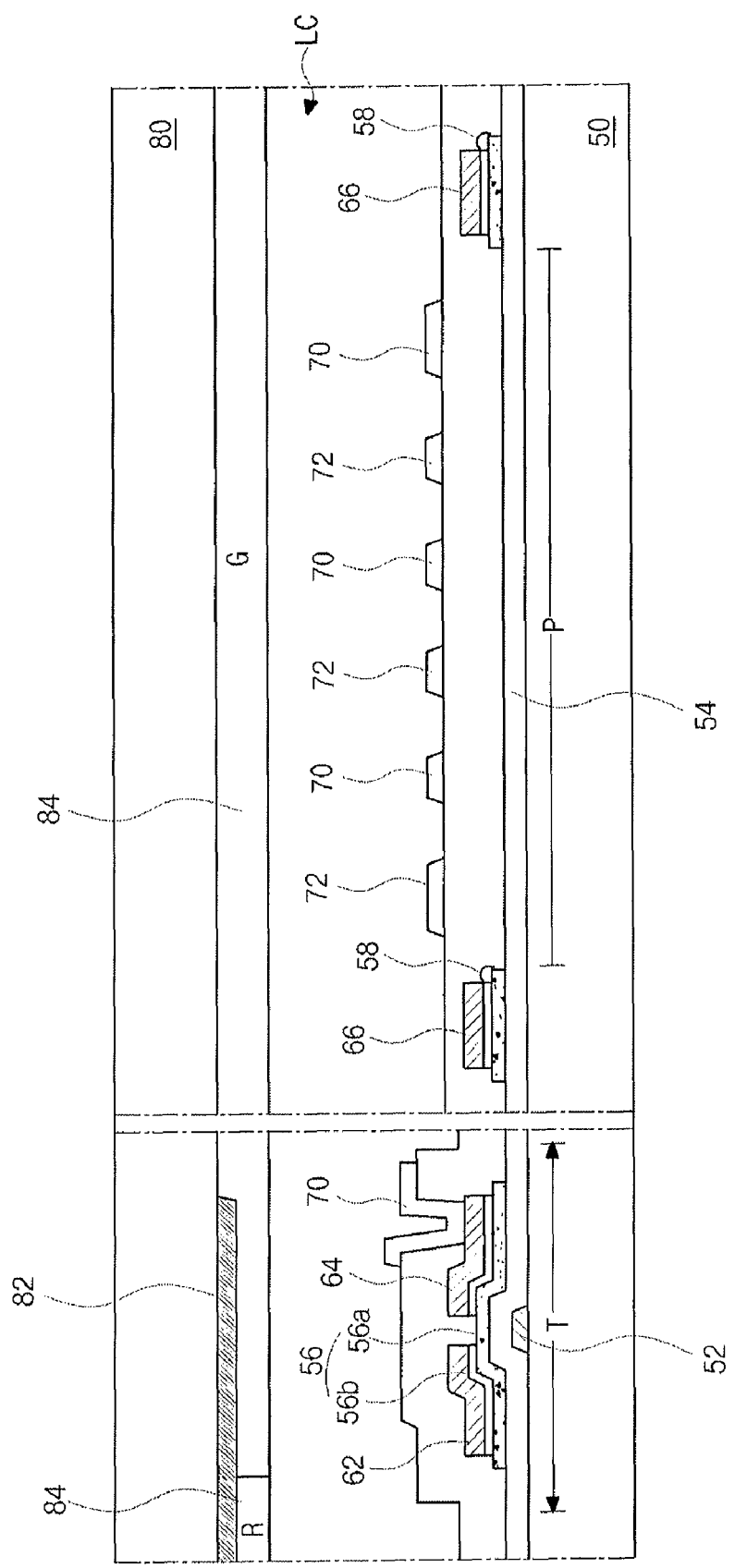
FIG. 2 is a cross-sectional view of an IPS mode LCD device including an array substrate according to a second embodiment of the related art.
Figure 3:
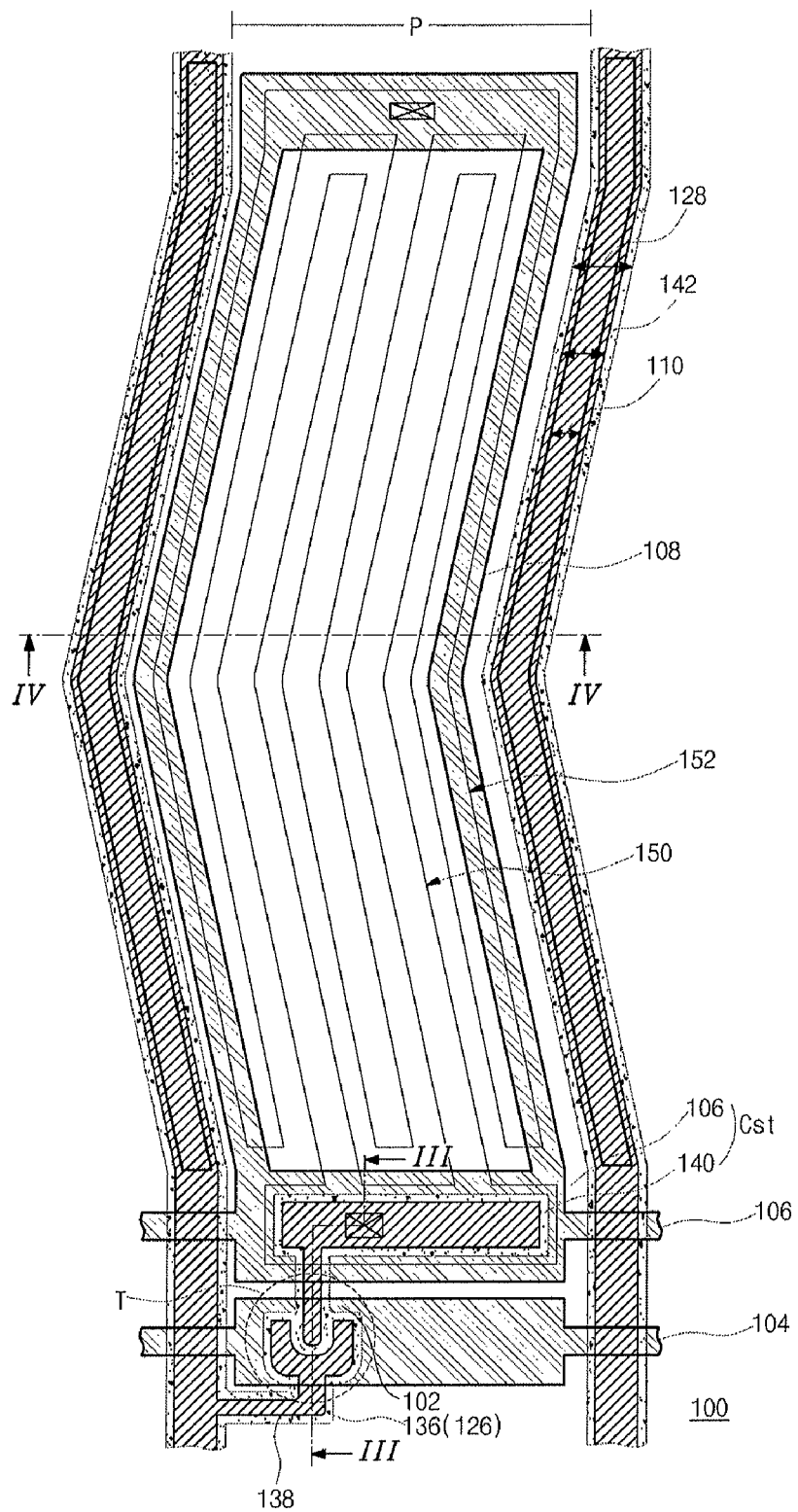
FIG. 3 is a schematic plan view of an array substrate for an IPS mode LCD device according to a first embodiment.

FIG. 3 is a schematic plan view of an array substrate for an in-plane switching (IPS) mode liquid crystal display (LCD) device according to a first embodiment. In FIG. 3, a gate line 104 and a common line 106 are formed along a first direction on a transparent insulating substrate 100. The gate line 104 and the common line 106 may be parallel to each other. A data line 142 is formed along a second direction. The data line 142 crosses the gate line 104 and the common line 106 to define a pixel region P. A thin film transistor T is formed near a crossing point of the gate line 104 and the data line 142. The thin film transistor T includes a gate electrode 102, a first semiconductor layer 126, a source electrode 138 and a drain electrode 140. A part of the gate line 104 functions as the gate electrode 102. The first semiconductor layer 126 is disposed on the gate electrode 102 and includes an active layer 136. The source and drain electrodes 138 and 140 are formed on the first semiconductor layer 126 and are spaced apart from each other.

A second semiconductor layer 128 is formed under the data line 142. The second semiconductor layer 128 extends from the first semiconductor layer 126. The second semiconductor layer 128 is partially exposed at both sides of the data line 142.

Common electrodes 152 and pixel electrodes 150 are formed of a transparent conductive material in the pixel region P. Each of the common electrodes 152 and the pixel electrodes 150 has a rod shape. The pixel electrodes 150 are connected to the drain electrode 140. The common electrodes 152 and the pixel electrodes 150 are bent. Common patterns 108 are formed along peripheries of the pixel region P. The common patterns 108 extend from the common line 106 and form a closed loop with the common line 106. The common patterns 108 are connected to the common electrodes 152. The common patterns 108 prevent signals of the data line 142 from affecting the pixel region P.

The drain electrode 140 extends over the common line 106. The drain electrode 140 overlaps the common line 106 with an insulating layer (not shown) therebetween to constitute a storage capacitor Cst.

In the first embodiment, a blocking pattern 110 is formed under the second semiconductor layer 128.

Figure 4A:
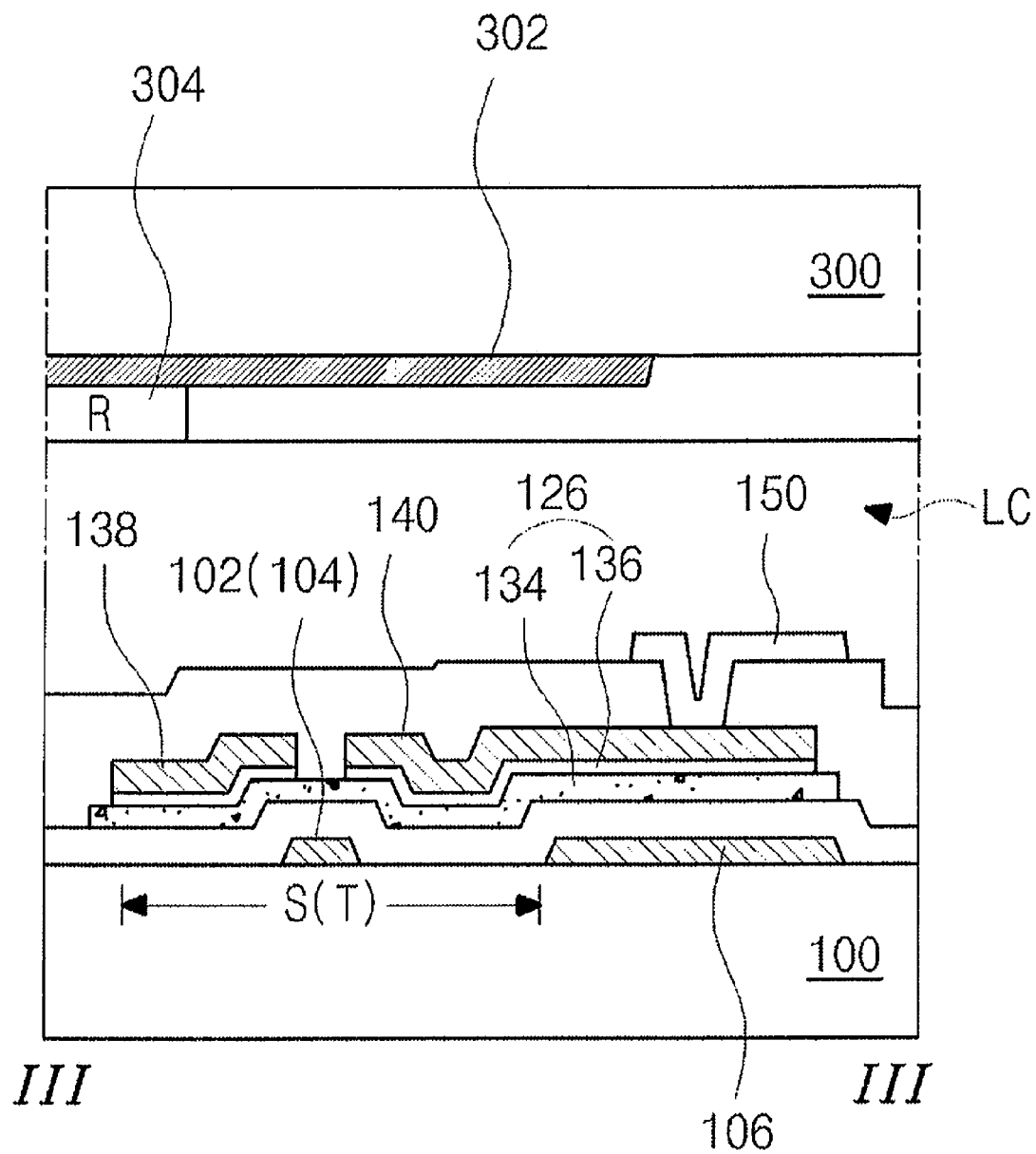
FIGS. 4A and 4B are cross-sectional views of an IPS mode LCD device according to the first embodiment.
Figure 4B:
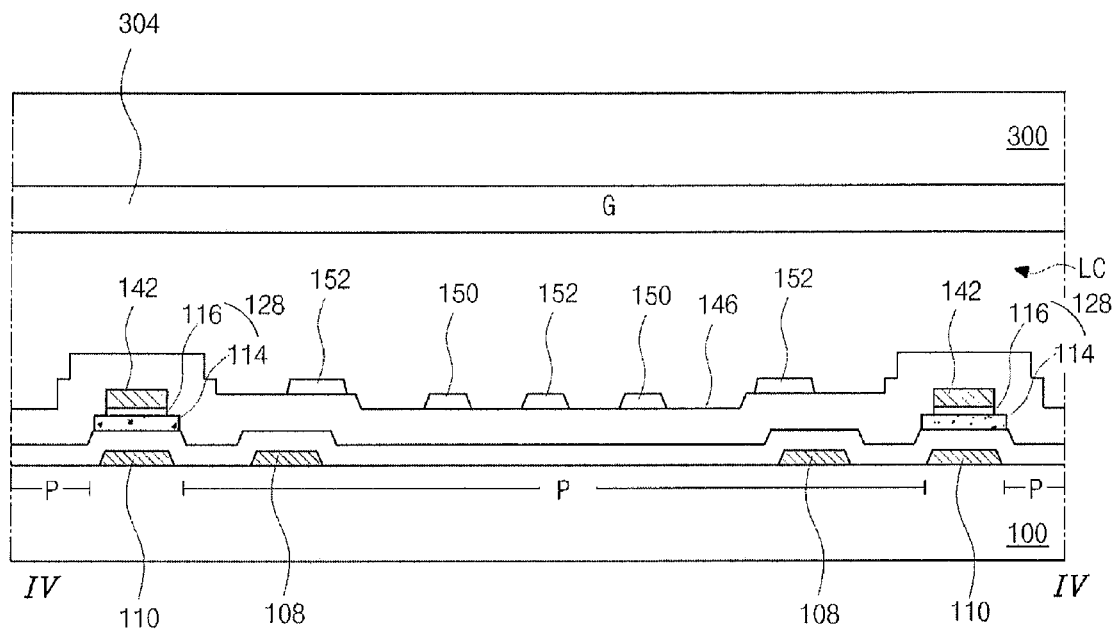

FIGS. 4A and 4B are cross-sectional views of an IPS mode LCD device according to the first embodiment. FIGS. 4A and 4B correspond to the line and the line IV-IV of FIG. 3, respectively.

In FIGS. 4A and 4B, the IPS mode LCD device includes a first substrate 100, a second substrate 300, and a liquid crystal layer LC interposed between the first and second substrates 100 and 300. The first and second substrates 100 and 300 may be transparent.

A black matrix 302 and a color filter layer 304 are formed on an inner surface of the second substrate 300. The black matrix 302 is disposed over the gate line 104, the data line 142 and the thin film transistor T. The color filter layer 304 is disposed over the pixel region P.

Common electrodes 152, pixel electrodes 150, common patterns 108 and a thin film transistor T are formed on an inner surface of the first substrate 100. The common electrodes 152 and the pixel electrodes 150 are disposed in a pixel region P and are substantially transparent. Each of the common electrodes 152 and the pixel electrodes 150 may have a rod shape. The common electrodes 152 alternate with the pixel electrodes 150. The thin film transistor T is disposed in a switching region S. The thin film transistor T includes a gate electrode 102, a gate insulating layer 112, a first semiconductor layer 126, a source electrode 138 and a drain electrode 140. The first semiconductor layer 126 is composed of an active layer 134 and an ohmic contact layer 136. The common patterns 108 are formed along peripheries of the pixel region P.

A data line 142 is formed along a side of the pixel region P. A second semiconductor layer 128 is formed under the data line 142. The second semiconductor layer 128 extends from the first semiconductor layer 126 and includes an intrinsic amorphous silicon layer 114 and an impurity-doped amorphous silicon layer 116. The intrinsic amorphous silicon layer 114 of the second semiconductor layer 128 is exposed at both sides of the data line 142.

A gate line 104 is further formed on the first substrate 100. A part of the gate line 104 functions as the gate electrode 102. Although not shown in the figure, the gate line 104 crosses the data line 142 to define the pixel region P. A common line 106 is spaced apart from the gate line 104 on the first substrate 100. The common line 106 overlaps the drain electrode 140.

A blocking pattern 110 is formed under the data line 142. The blocking pattern 110 may be formed of the same material and in the same layer as the gate line 104, the common line 106, and the common patterns 108. The blocking pattern 110 prevents light emitted from a backlight, which may be disposed at a rear side of the first substrate 100, from reaching the second semiconductor layer 128. The second semiconductor layer 128 is not affected by the light of the backlight driven according to a dimming frequency. Thus, the wavy noise may be prevented, and a high quality IPS mode LCD device may be provided.

Here, as stated above, the common patterns 108 and the blocking pattern 110 are formed in the same layer. To prevent a short circuit between the common patterns 108 and the blocking pattern 110, the blocking pattern 110 may have a narrower width than the second semiconductor layer 128. Even though the blocking pattern 110 only partially screens the second semiconductor layer 128, wavy noise can be prevented. That is, since wavy noise does not occur if more than 40% of the second semiconductor layer 128 is screened, the blocking pattern 110 is designed accordingly.

A method of manufacturing an array substrate for an IPS mode LCD device will be described hereinafter with the accompanying drawings.

FIGS. 5A to 5H and FIGS. 6A to 6H are cross-sectional views of an array substrate for an IPS mode LCD device in processes of manufacturing the same and correspond to the line and the line IV-IV of FIG. 3, respectively.

Figure 5A:
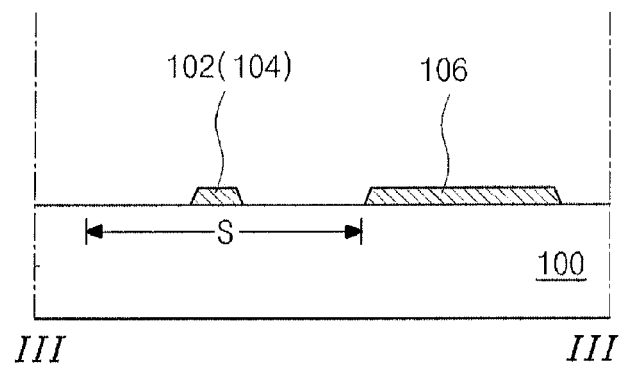
Figure 6A:
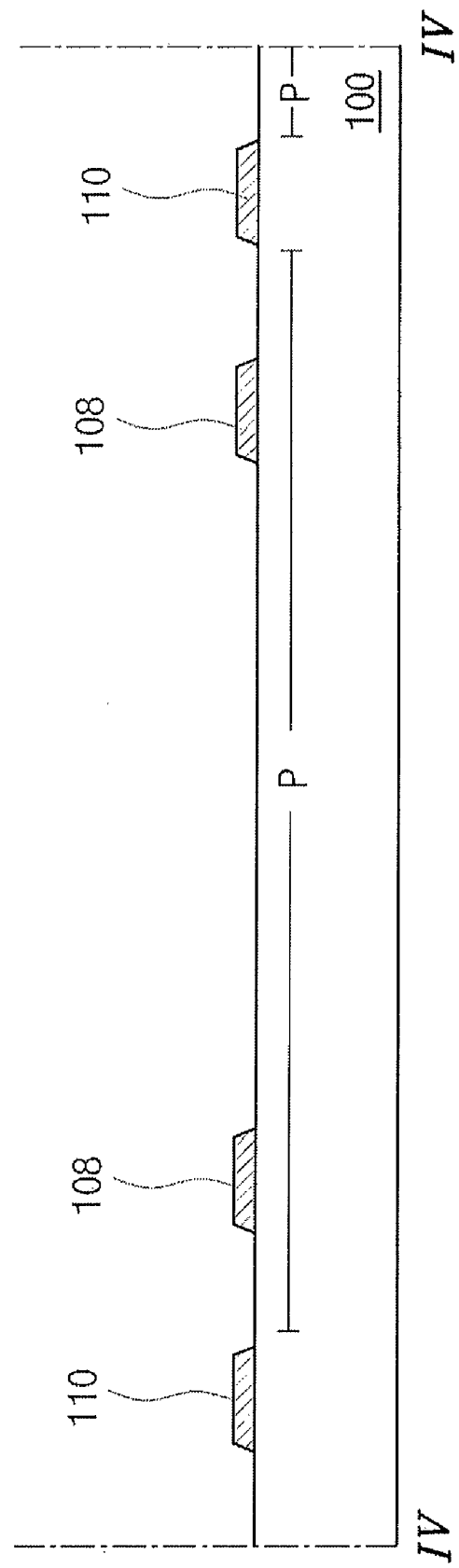

FIG. 5A and FIG. 6A show the array substrate in a first mask process. A conductive metallic material is deposited on a substrate 100 on which pixel regions P and switching regions S are defined. The conductive metallic material is patterned through a first mask process to thereby form a gate line 104, a gate electrode 102, a common line 106, common patterns 108, and a blocking pattern 110. The gate line 104 is formed along a first side of the pixel region P, and a part of the gate line 104 may act as the gate electrode 102. The common line 106 is spaced apart from and parallel to the gate line 104. The common patterns 108 are connected to the common line 106 and are formed along the peripheries of the pixel region P. The common patterns 108 form a closed loop with the common line 106. The blocking pattern 110 is formed along a second side of the pixel region P, wherein the second side is perpendicular to the first side.

The conductive metallic material may include one or more materials selected from a conductive metallic group including aluminum (Al), an aluminum alloy of aluminum neodymium (AlNd), tungsten (W), copper (Cu), chromium (Cr) and molybdenum (Mo).

FIGS. 5B to 5F and FIGS. 6B to 6F show the array substrate in a second mask process.

Figure 5B:
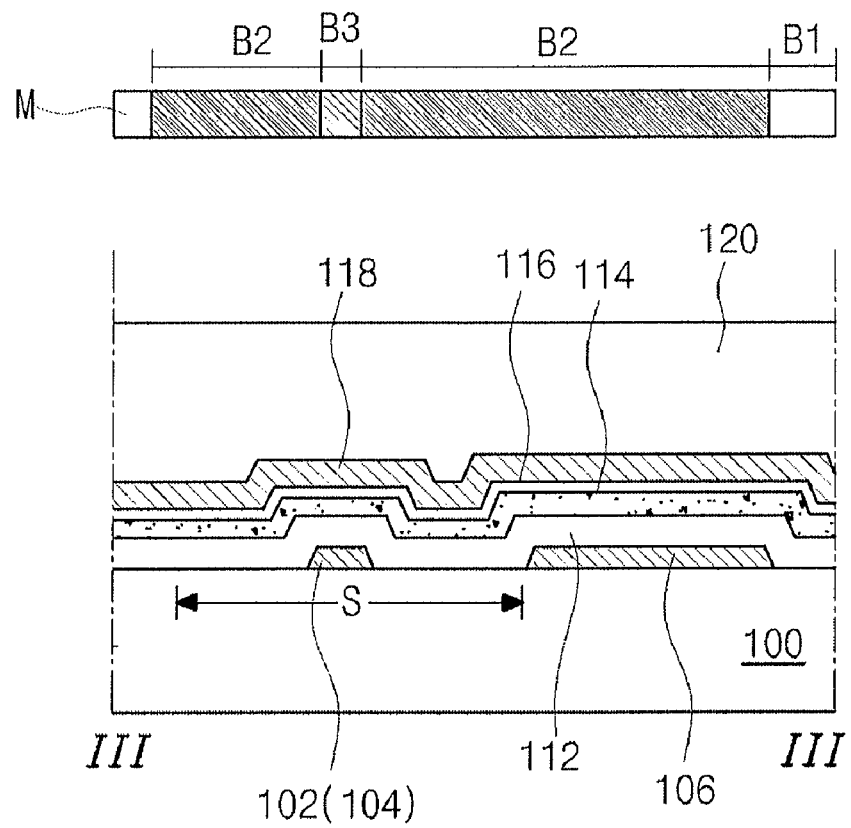
Figure 6B:
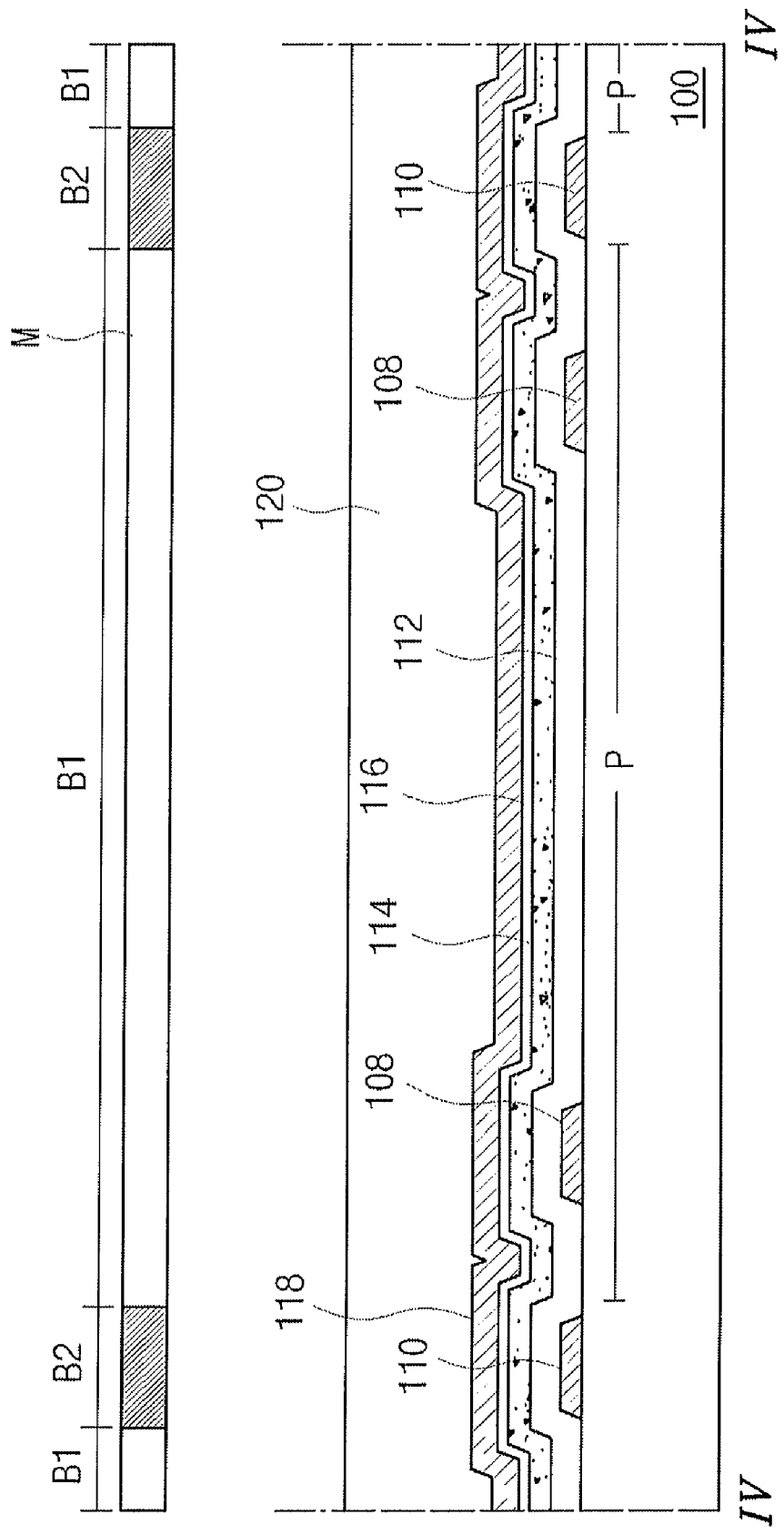

In FIG. 5B and FIG. 6B, a gate insulating layer 112 is formed on substantially an entire surface of the substrate 100 including the gate line 104, the common line 106, the common patterns 108 and the blocking pattern 110 thereon by depositing a material selected from an inorganic insulating material group including silicon nitride ($SiN_x$) and silicon oxide ($SiO_2$).

An intrinsic amorphous silicon layer 114 and an impurity-doped amorphous silicon layer 116 are sequentially formed on the gate insulating layer 112 by depositing amorphous silicon (e.g., a-Si:H) and impurity-doped amorphous silicon (e.g., n+a-Si:H).

A conductive metallic layer 118 is formed substantially on an entire surface of the substrate 100 including the impurity-doped amorphous silicon layer 116 by depositing one or more selected from the above-mentioned conductive metallic group. A photoresist layer 120 is formed on the conductive metallic layer 118 by coating the substrate 100 with photoresist.

A mask M is disposed over the photoresist layer 120. The mask M includes a light-transmitting portion B1, a light-blocking portion B2, and a light-half transmitting portion B3. The light-half transmitting portion B3 corresponds to the gate electrode 102 in the switching region S, the light-blocking portion B2 corresponds to the blocking pattern 110 and the other parts in the switching region S, and the light-transmitting portion B1 corresponds to the pixel region P.

The photoresist layer 120 is exposed to light through the mask M. The part of the photoresist layer 120 over the gate electrode 102 is partially exposed while the part of the photoresist layer 120 in the pixel region P is substantially completely exposed.

Next, the light-exposed photoresist layer 120 is developed.

Figure 5C:
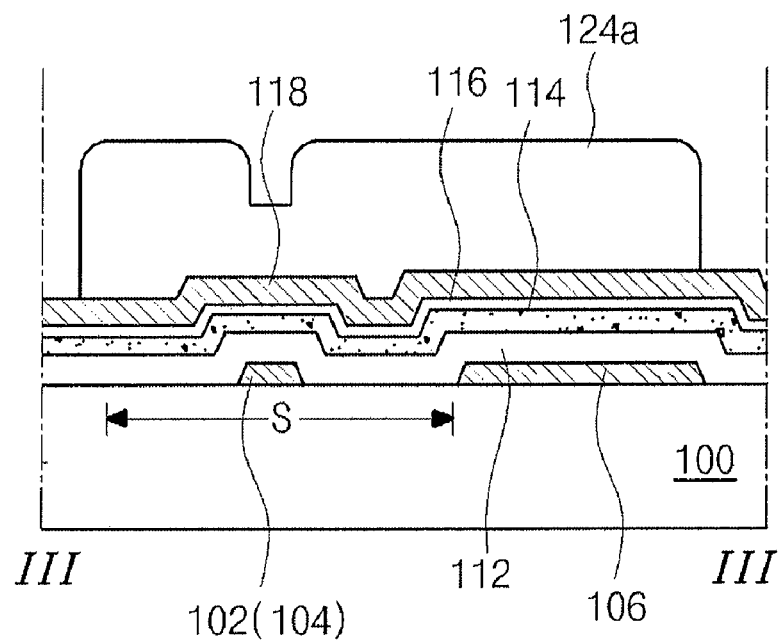
Figure 6C:
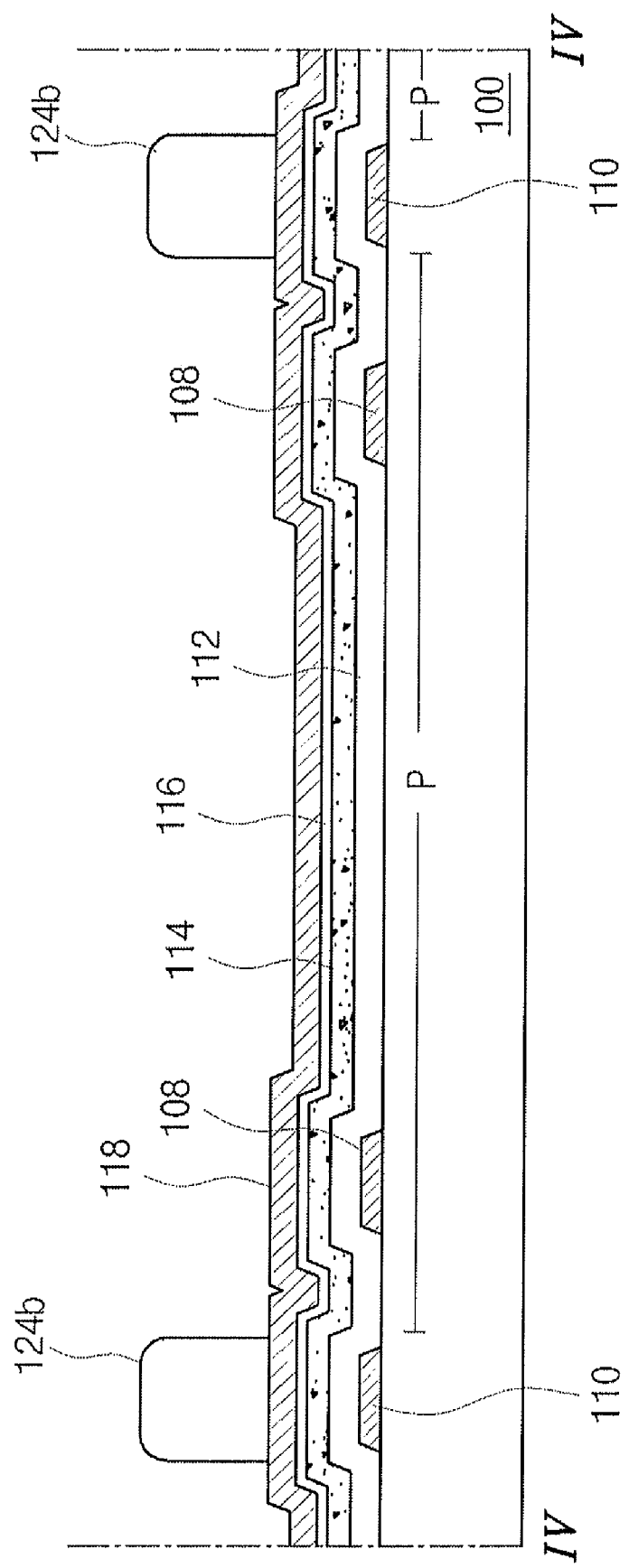

In FIGS. 5C and 6C, a first photoresist pattern 124a and a second photoresist pattern 124b are formed, and the conductive metallic layer 118 is partially exposed. The first photoresist pattern 124a is disposed in the switching region S and has two parts of different thicknesses. The first photoresist pattern 124a extends over the common line 106. The second photoresist pattern 124b extends from the first photoresist pattern 124a along the second side of the pixel region P. The second photoresist pattern 124b is disposed over the blocking pattern 110.

Figure 5D:
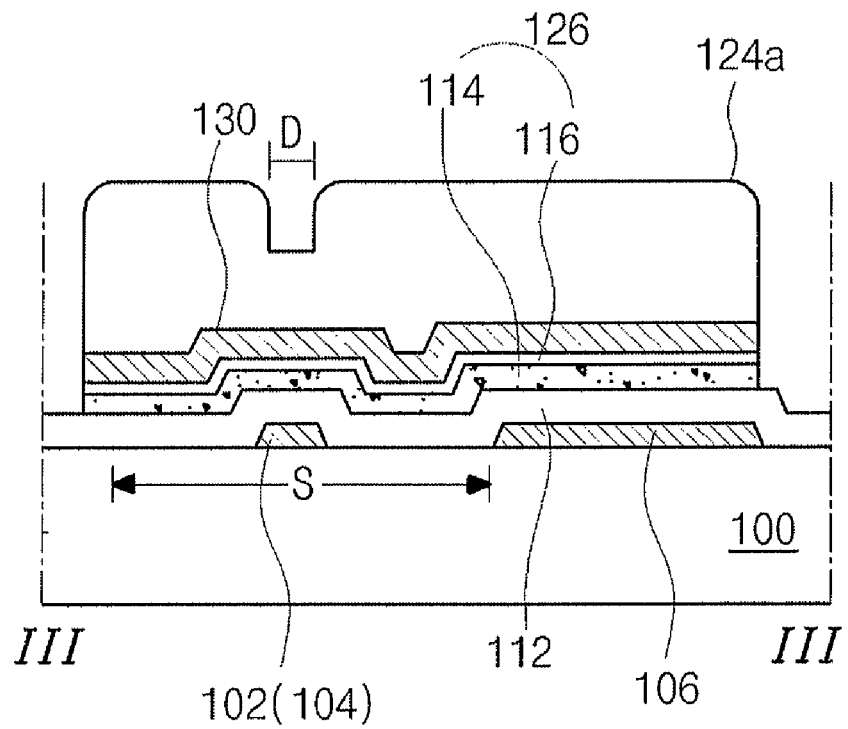
Figure 6D:
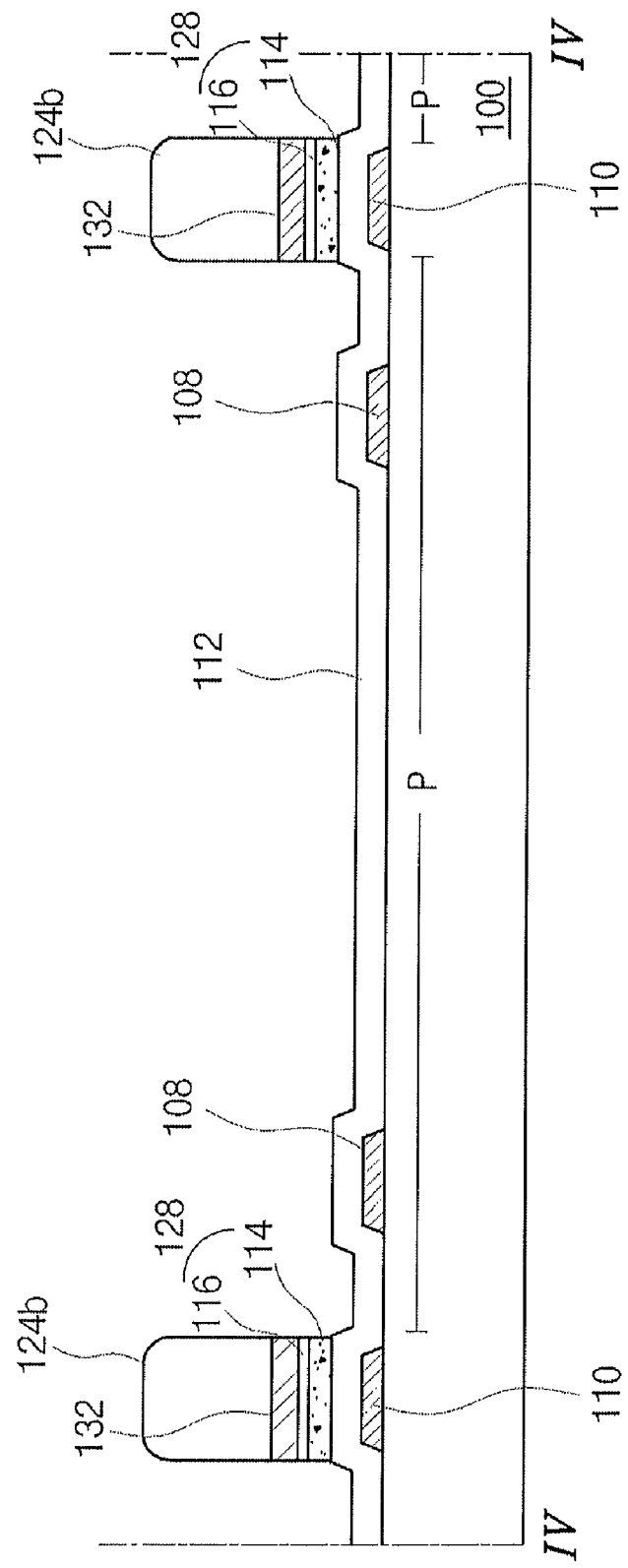

In FIG. 5D and FIG. 6D, the exposed conductive metallic layer 118, the impurity-doped amorphous silicon layer 116, and the intrinsic amorphous silicon layer 114 are removed, and the gate insulating layer 112 is exposed.

In general, the impurity-doped amorphous silicon layer 116 and the intrinsic amorphous silicon layer 114 are dry-etched. Therefore, the conductive metallic layer 118 may be dry-etched together with the impurity-doped amorphous silicon layer 116 and the intrinsic amorphous silicon layer 114. Or, after the conductive metallic layer 118 is wet-etched, the impurity-doped amorphous silicon layer 116 and the intrinsic amorphous silicon layer 114 may be dry-etched.

A first semiconductor layer 126 and a first metallic pattern 130 are sequentially formed under the first photoresist pattern 124a, and a second semiconductor layer 128 and a second metallic pattern 132 are sequentially formed under the second photoresist pattern 124b. Each of the first semiconductor layer 126 and the second semiconductor layer 128 includes the impurity-doped amorphous silicon layer 116 and the intrinsic amorphous silicon layer 114. The second semiconductor layer 128 extends from the first semiconductor layer 126. The second metallic pattern 132 extends from the first metallic pattern 130.

Figure 5E:
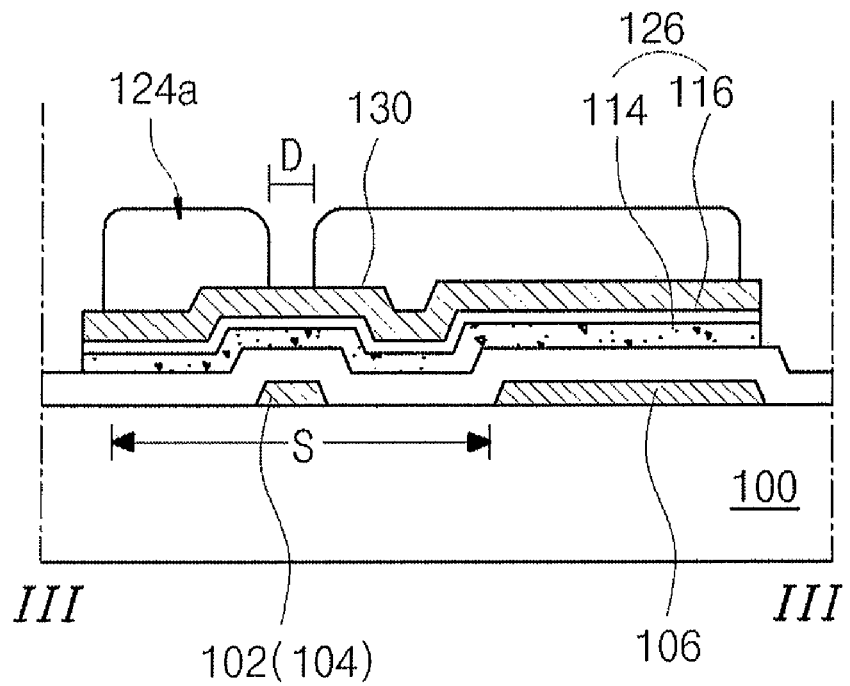

Next, in FIG. 5E and FIG. 6E, an ashing process is performed. The part "D" of the first photoresist pattern 124a, which is disposed over the gate electrode 102 and is thinner than the other part, is removed to thereby partially expose the first metallic pattern 130. At this time, the other parts of the first photoresist pattern 124a and the second photoresist pattern 124b are also partially removed, and the thicknesses of the other parts of the first photoresist pattern 124a and the second photoresist pattern 124b are decreased. In addition, the first and second photoresist patterns 124a and 124b have top surfaces of an arc shape even though not shown in the figures. That is, the thicknesses of the photoresist patterns 124a and 124b in the center are thicker than those in the edges. Therefore, during the ashing process, the edges of the first and second photoresist patterns 124a and 124b are also removed, and edges of the first metallic pattern 130 and the second metallic pattern 132 are partially exposed.

Figure 5F:
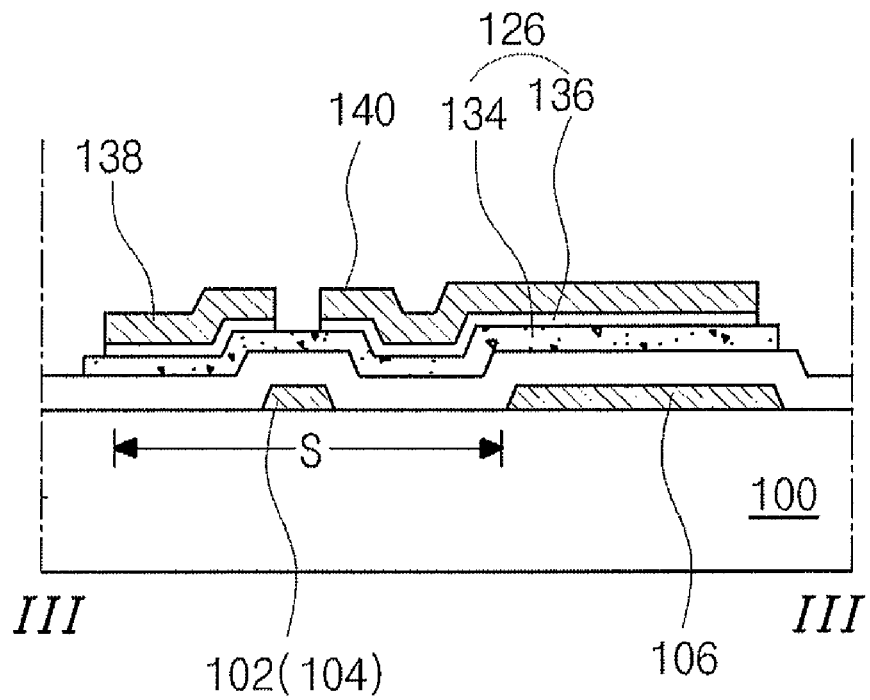

In FIGS. 5F and 6F, the first metallic pattern 130 of FIG. 5E is partially removed, and a source electrode 138 and a drain electrode 140 are formed in the switching region S. The source and drain electrodes 138 and 140 are spaced apart from each other over the gate electrode 102. The second metallic pattern 132 of FIG. 6E extending from the source electrode 138 becomes as a data line 142.

Subsequently, the impurity-doped amorphous silicon layer 116 of FIG. 5E is partially removed between the source and drain electrodes 138 and 140. The partially removed impurity-doped amorphous silicon layer of the first semiconductor layer 126 is referred to as an ohmic contact layer 136, and the intrinsic amorphous silicon layer of the first semiconductor layer 126 is referred to as an active layer 134.

When the first metallic pattern 130 of FIG. 5E and the impurity-doped amorphous silicon layer 116 of FIG. 5E are removed over the gate electrode 102, the edges of the first and second metallic patterns 130 and 132 of FIGS. 5E and 6E and the first and second semiconductor layers 126 and 128, more particularly, the impurity-doped amorphous silicon layers 116 of FIG. 5E and FIG. 6E, may be partially removed. Therefore, peripheries of the active layer 134 of the first semiconductor layer 126 and the intrinsic amorphous silicon layer 114 of the second semiconductor layer 128 are exposed.

The first and second photoresist patterns 124a and 124b of FIG. 5E and FIG. 6E are removed.

Figure 5G:
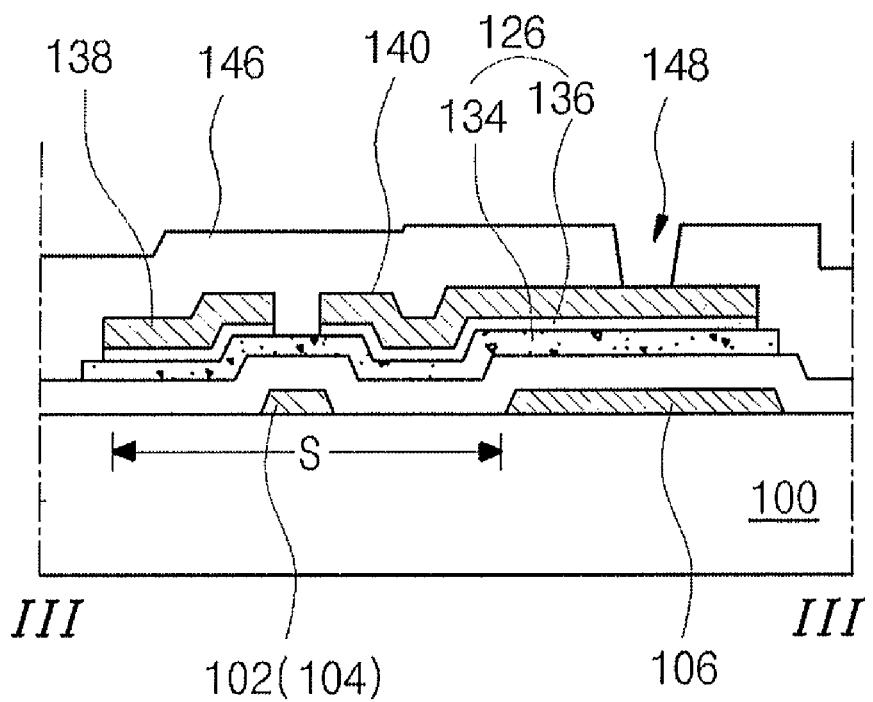
Figure 6G:
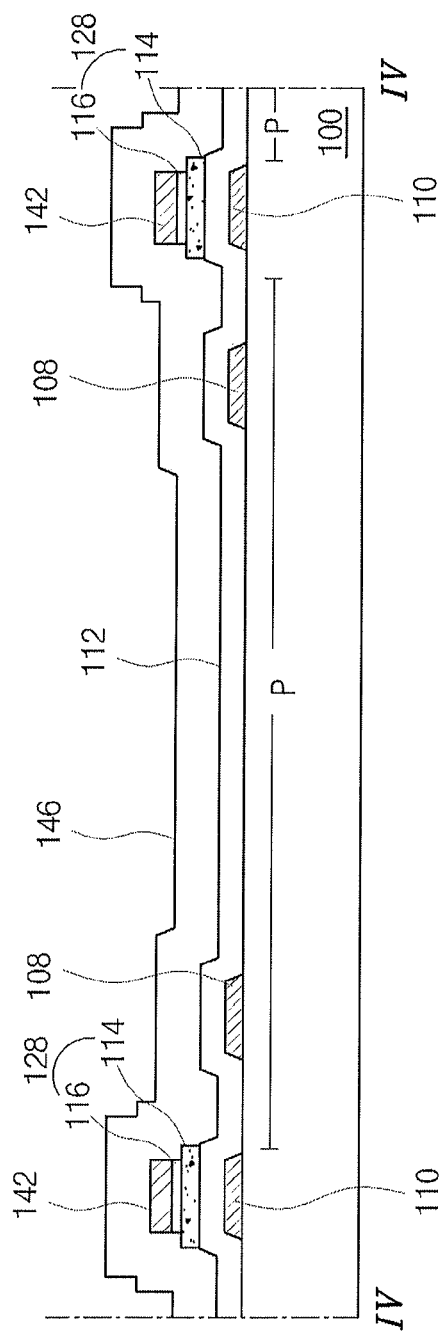

FIG. 5G and FIG. 6G show the array substrate in a third mask process. In FIG. 5G and FIG. 6G, a passivation layer 146 is formed on substantially an entire surface of the substrate 100 including the source and drain electrodes 138 and 140 and the data line 142. The passivation layer 146 may be formed by depositing one or more materials selected from an inorganic insulating material group, including silicon nitride and silicon oxide, or by coating the substrate 100 with one or more materials selected from an organic insulating material group, including benzocyclobutene (BCB) and acrylic resin. Next, the passivation layer 146 is patterned through a third mask process, and a drain contact hole 148 and a common pattern contact hole (not shown) are formed. The drain contact hole 148 partially exposes the drain electrode 140, and the common pattern contact hole partially exposes the common patterns 108.

Figure 5H:
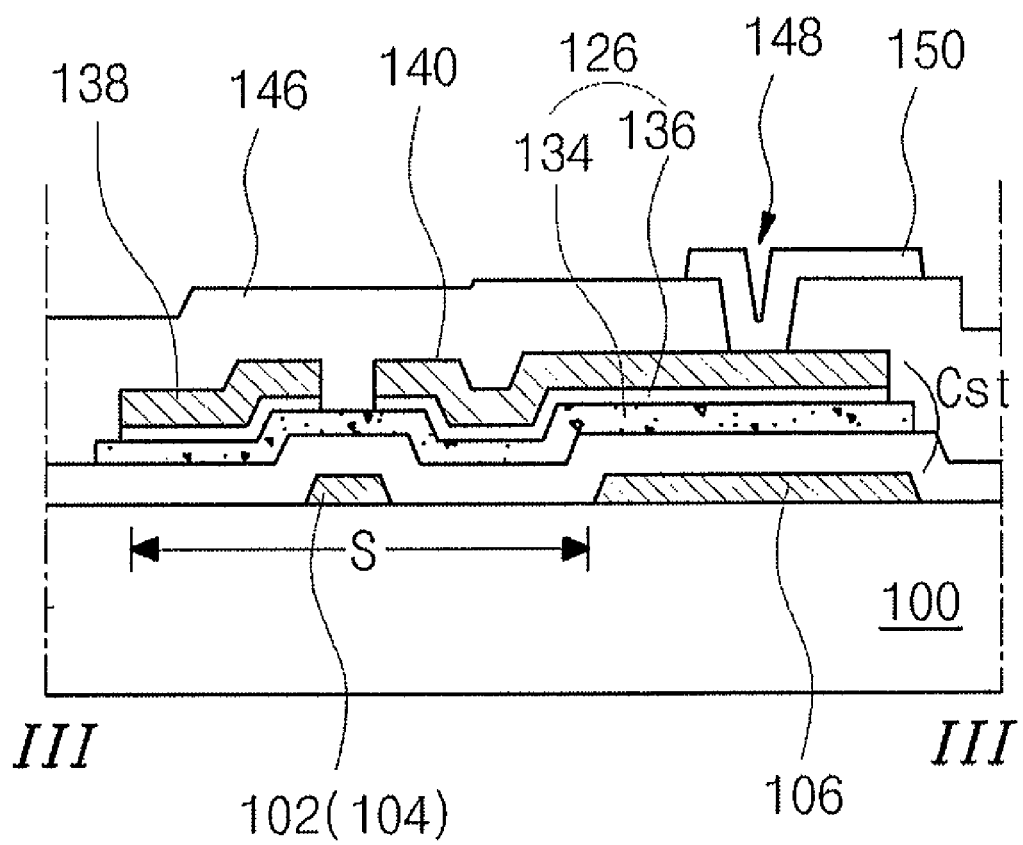
Figure 6H:
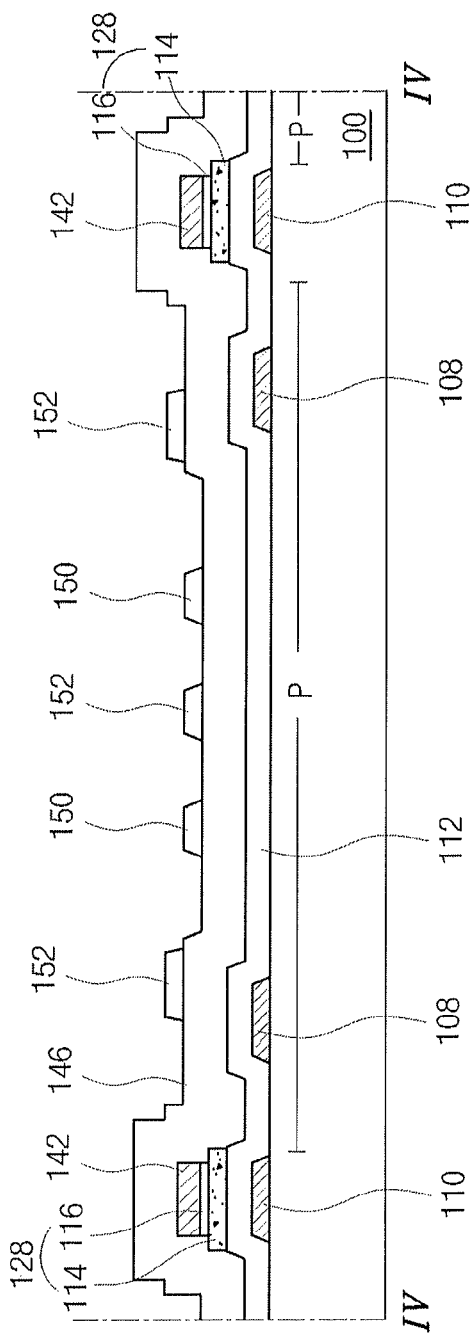

FIG. 5H and FIG. 6H show the array substrate in a fourth mask process. In FIG. 5H and FIG. 6H, a transparent conductive layer is deposited substantially on an entire surface of the substrate 100 including the passivation layer 146 thereon. The transparent conductive layer may be selected from a transparent conductive material group including indium tin oxide (ITO) and indium zinc oxide (IZO). The transparent conductive layer is patterned through a fourth mask process, and pixel electrodes 150 and common electrodes 152 are formed in the pixel region P. The pixel electrodes 150 contact the drain electrode 140 through the drain contact hole 148, and the pixel electrodes 150 are electrically connected to the drain electrode 140. Although not shown, the common electrodes 152 contact the common patterns 108 through the common pattern contact hole, and the common electrodes 152 are electrically connected to the common patterns 108 and the common line 106. The pixel electrodes 150 alternate with the common electrodes 152.

The drain electrode 140 extends over the common line 106. A part of the drain electrode 140 overlaps the common line 106 to form a storage capacitor Cst, wherein the common line 106 acts as a first electrode of the storage capacitor Cst, and the part of the drain electrode 140 functions as a second electrode of the storage capacitor Cst.

In the first embodiment, the blocking pattern 110 has a narrower width than the second semiconductor layer 128 under the data line 142. The blocking pattern may have the same width as or a wider width than the second semiconductor layer under the data line.

Figure 7:
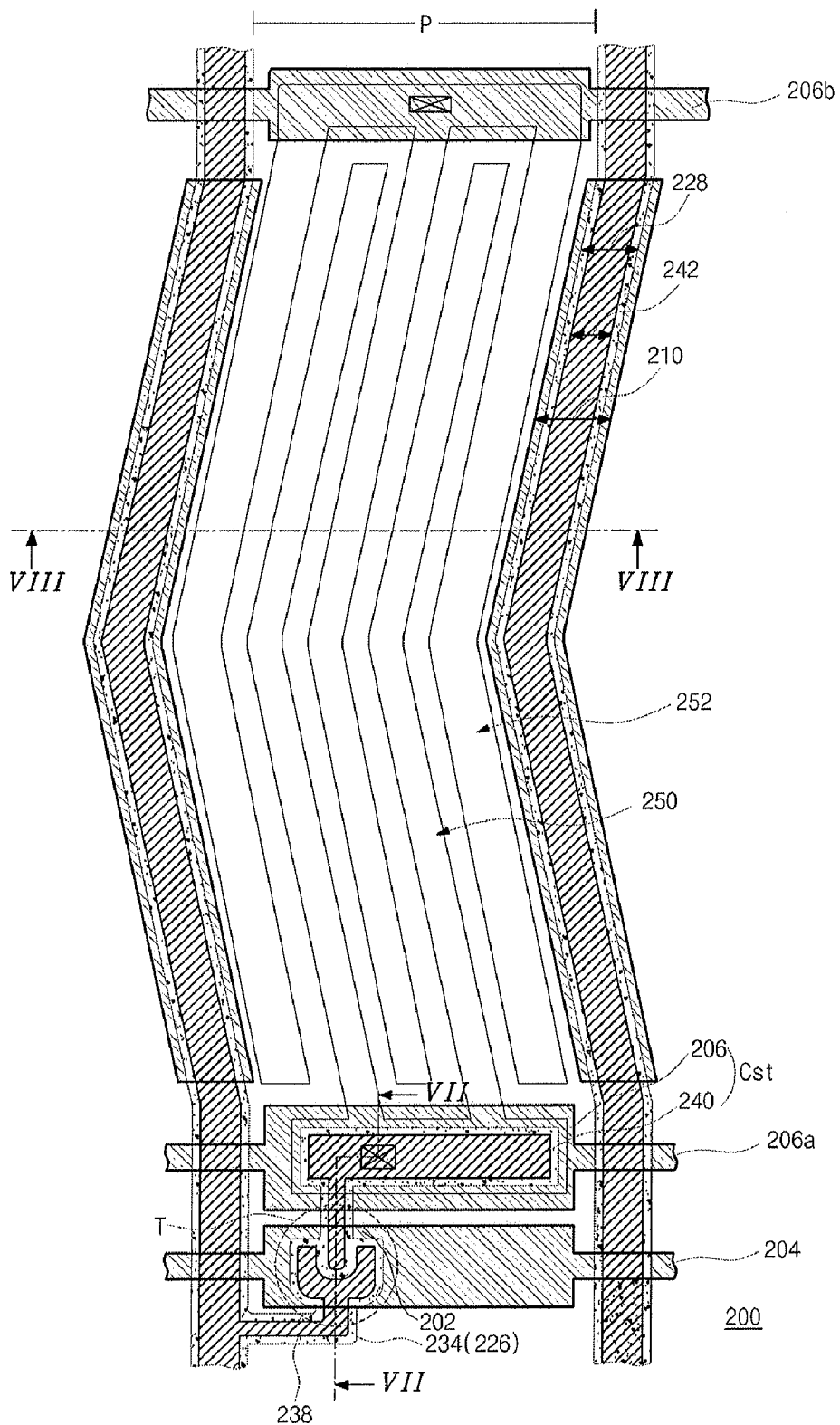
FIG. 7 is a plan view of an array substrate for an IPS mode LCD device according to a second embodiment.

FIG. 7 is a plan view of an array substrate for an IPS mode LCD device according to a second embodiment.

In FIG. 7, a gate line 204 is formed along a first direction on a transparent insulating substrate 200. A data line 242 is formed along a second direction. The gate line 204 and the data line 242 cross each other to define a pixel region P. A first common line 206a and a second common line 206b are formed along the first direction. The first and second common lines 206a and 206b are disposed at opposite sides of the pixel region P, and more particularly, at a lower side and an upper side of the pixel region P, respectively, in the context of FIG. 7.

A thin film transistor T is formed near to a crossing point of the gate line 204 and the data line 242 and connected to the gate line 204 and the data line 242. The thin film transistor T includes a gate electrode 202, a first semiconductor layer 226, a source electrode 238 and a drain electrode 240. A part of the gate line 204 functions as the gate electrode 202. The first semiconductor layer 226 is disposed on the gate electrode 202 and includes an active layer 234. The source and drain electrodes 238 and 240 are formed on the first semiconductor layer 226 and are spaced apart from each other.

A second semiconductor layer 228 is formed under the data line 242. The second semiconductor layer 228 extends from the first semiconductor layer 226. The second semiconductor layer 228 is partially exposed at both sides of the data line 242.

Common electrodes 252 and pixel electrodes 250 are formed in the pixel region P. The pixel electrodes 250 are connected to the drain electrode 240, and the common electrodes 252 are connected to the second common line 206b. The common electrodes 252 and the pixel electrodes 250 are transparent and have a rod shape. The common electrodes 252 and the pixel electrodes 250 are bent.

A part of the drain electrode 240 extends over the first common line 206a. The drain electrode 240 overlaps the first common line 206a to form a storage capacitor Cst, wherein the first common line 206a acts as a first electrode of the storage capacitor Cst, and the part of the drain electrode 240 functions as a second electrode of the storage capacitor Cst.

A blocking pattern 210 is formed under the second semiconductor layer 228. The blocking pattern 210 may have the same width as or a wider width than the second semiconductor layer 228. Here, to prevent a short circuit, the common patterns 108 of FIG. 3 are not formed. The common electrodes 252 that are adjacent to the data line 242 have a wider width than those in the first embodiment and function as the common pattern 108 of FIG. 3 in the first embodiment.

Figure 8A:
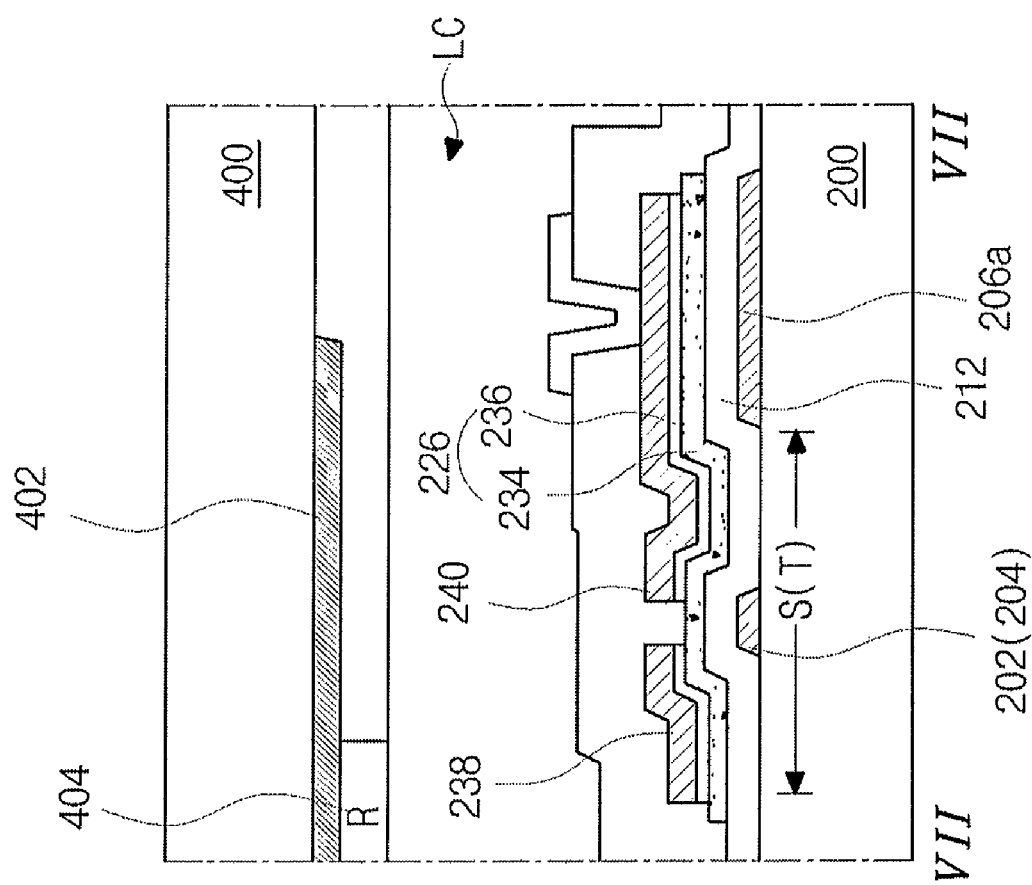
FIGS. 8A and 8B are cross-sectional views of an IPS mode LCD device according to the second embodiment.
Figure 8B:
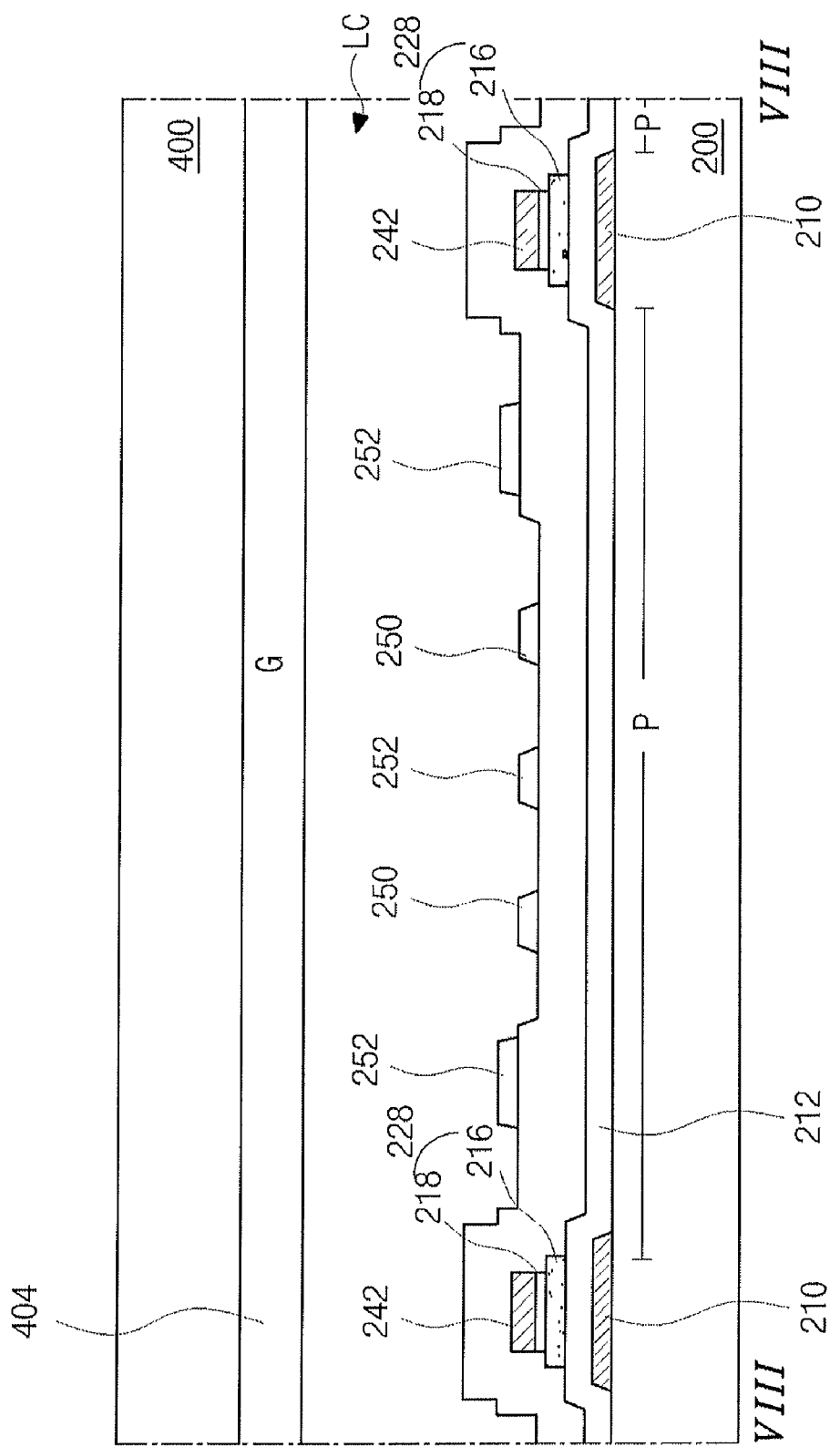

FIGS. 8A and 8B are cross-sectional views of an IPS mode LCD device according to the second embodiment of the present invention. FIGS. 8A and 8B correspond to the line VII-VII and the line VIII-VIII of FIG. 7, respectively.

In FIGS. 8A and 8B, the IPS mode LCD device of the second embodiment includes a first substrate 200, a second substrate 400, and a liquid crystal layer LC interposed between the first and second substrates 200 and 400. The first and second substrates 200 and 400 may be transparent.

Common electrodes 252, pixel electrodes 250, and a thin film transistor T are formed on the first substrate 200. The common electrodes 252 and the pixel electrodes 250 are disposed in a pixel region P and are substantially transparent. Each of the common electrodes 252 and the pixel electrodes 250 may have a rod shape. The common electrodes 252 alternate with the pixel electrodes 250. The thin film transistor T is disposed in a switching region S. The thin film transistor T includes a gate electrode 202, a gate insulating layer 212, a first semiconductor layer 226, a source electrode 238 and a drain electrode 240. The first semiconductor layer 226 is composed of an active layer 234 and an ohmic contact layer 236.

A data line 242 is formed along a side of the pixel region P. A second semiconductor layer 228 is formed under the data line 242. The second semiconductor layer 228 extends from the first semiconductor layer 226 and includes an intrinsic amorphous silicon layer 216 and an impurity-doped amorphous silicon layer 218. The intrinsic amorphous silicon layer 216 of the second semiconductor layer 228 is exposed at both sides of the data line 242.

A gate line 204 is further formed along another side of the pixel region P on the first substrate 200. A part of the gate line 204 functions as the gate electrode 202. Although not shown in the figure, the gate line 204 crosses the data line 242 to define the pixel region P. A first common line 206a and a second common line 206b of FIG. 7 are spaced apart from the gate line 204 on the first substrate 200.

A blocking pattern 210 is formed under the data line 242. The blocking pattern 210 may be formed of the same material and in the same layer as the gate line 204, the gate electrode 202, and the first and second common lines 206a and 206b. The blocking pattern 210 prevents light emitted from a backlight, which may be disposed at a rear side of the first substrate 200, from reaching the second semiconductor layer 228. Because the light is screened by the blocking pattern 210, currents in the second semiconductor layer 228 may be avoided. Thus, wavy noise may be prevented.

A black matrix 402 and a color filter layer 404 are formed on an inner surface of the second substrate 400. The black matrix 402 is disposed over the gate line 204, the data line 242 and the thin film transistor T. The color filter layer 404 is disposed over the pixel region P.

The array substrate according to the second embodiment may be manufactured through the same processes as those according to the first embodiment, and the process will not be described.

In the first and second embodiments, the blocking pattern is formed under the second semiconductor layer and prevents the light from going into the second semiconductor layer. In a third embodiment, the blocking pattern is formed over the second semiconductor layer. Therefore, although light may reach the second semiconductor layer and currents may be generated in the second semiconductor layer, wavy noise can be prevented by shielding effects.

Figure 9A:
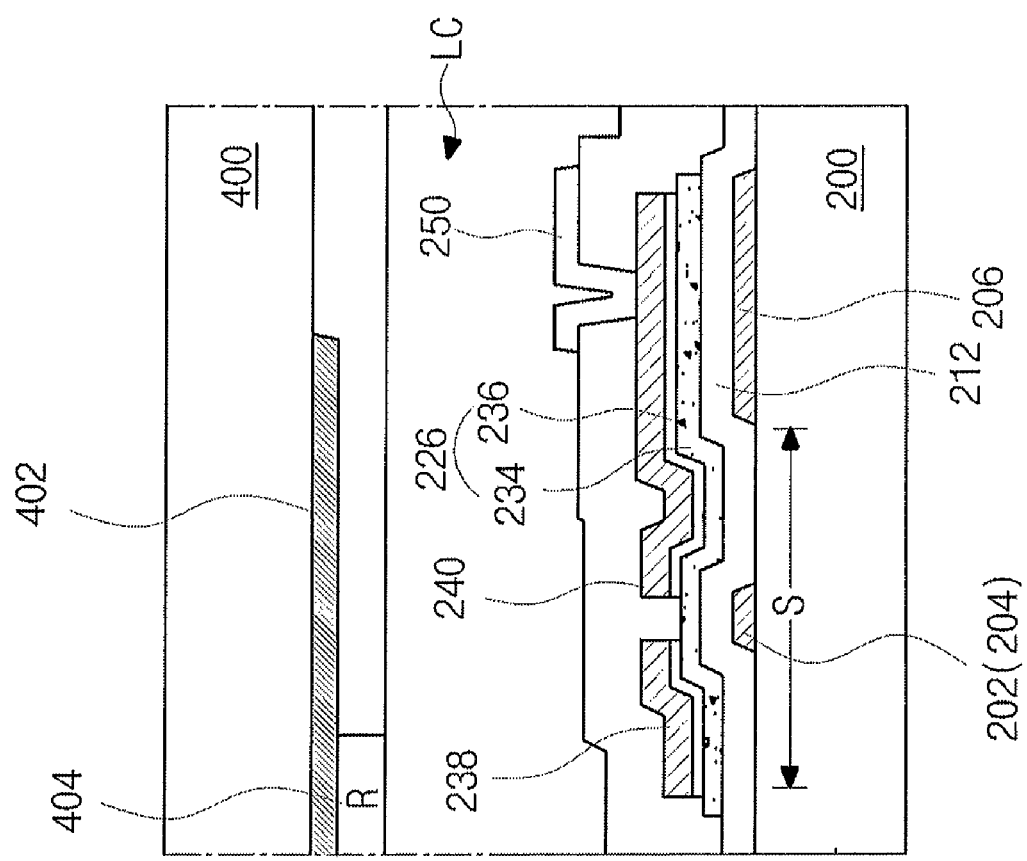
FIGS. 9A and 9B are cross-sectional views of an IPS mode LCD device according to a third embodiment.
Figure 9B:
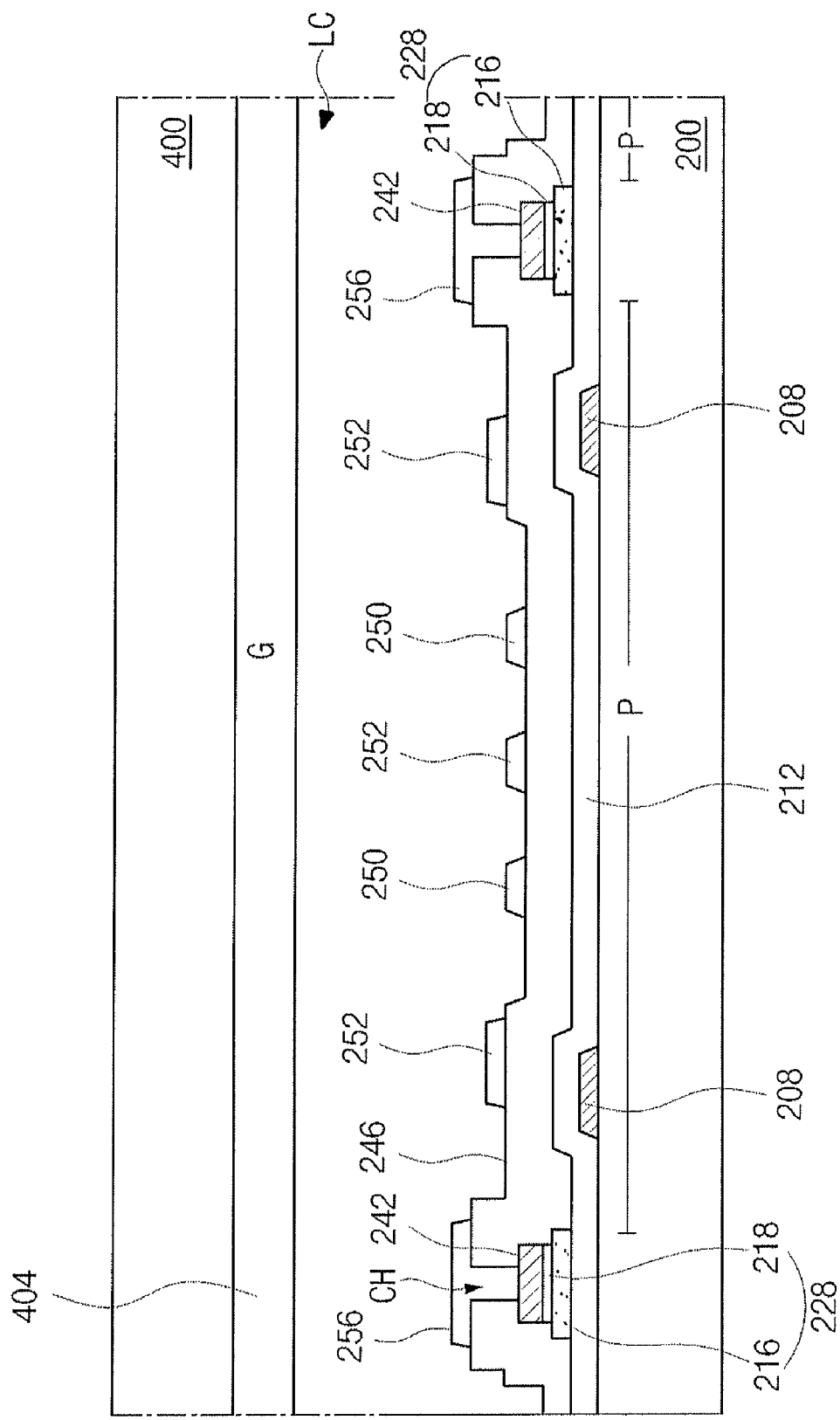

FIGS. 9A and 9B are cross-sectional views of an IPS mode LCD device according to the third embodiment.

In FIGS. 9A and 9B, the IPS mode LCD device of the third embodiment includes a first substrate 200, a second substrate 400, and a liquid crystal layer LC interposed between the first and second substrates 200 and 400. The first and second substrates 200 and 400 may be transparent.

Common electrodes 252, pixel electrodes 250, common patterns 208 and a thin film transistor T are formed on the first substrate 200. The common electrodes 252 and the pixel electrodes 250 are disposed in a pixel region P and are substantially transparent. Each of the common electrodes 252 and the pixel electrodes 250 may have a rod shape. The common electrodes 252 alternate with the pixel electrodes 250. The thin film transistor T is disposed in a switching region S. The thin film transistor T includes a gate electrode 202, a gate insulating layer 212, a first semiconductor layer 226, a source electrode 238 and a drain electrode 240. The first semiconductor layer 226 is composed of an active layer 234 and an ohmic contact layer 236. The common patterns 208 are formed along peripheries of the pixel region P.

A data line 242 is formed along a side of the pixel region P. A second semiconductor layer 228 is formed under the data line 242. The second semiconductor layer 228 extends from the first semiconductor layer 226 and includes an intrinsic amorphous silicon layer 216 and an impurity-doped amorphous silicon layer 218. The intrinsic amorphous silicon layer 216 of the second semiconductor layer 228 is exposed at both sides of the data line 242.

A gate line 204 is further formed along another side of the pixel region P on the first substrate 200. A part of the gate line 204 functions as the gate electrode 202. Although not shown in the figure, the gate line 204 crosses the data line 242 to define the pixel region P. A common line 206 is spaced apart from the gate line 204 on the first substrate 200.

A blocking pattern 256 is formed over the data line 242. The blocking pattern 256 may be formed of the same material and in the same layer as the common electrodes 252 and the pixel electrodes 250. The blocking pattern 256 has a wider width than the second semiconductor layer 228 and covers the second semiconductor layer 228. The blocking pattern 256 randomly contacts the data line 242 through data contact holes CH formed in a passivation layer 246.

A black matrix 402 and a color filter layer 404 are formed on an inner surface of the second substrate 400. The black matrix 402 is disposed over the gate line 204, the data line 242 and the thin film transistor T. The color filter layer 404 is disposed over the pixel region P.

Even though currents may be generated in the second semiconductor layer 228 due to light from a backlight, the blocking pattern 256 shields an electric field from the second semiconductor layer 228, and the coupling between the second semiconductor layer 228 and the pixel and common electrodes 250 and 252 may be minimized. Accordingly, wavy noise on the screen of the IPS mode LCD device may be decreased.

As stated above, the blocking pattern 256 contacts the data line 242. Although the data line 242 may be cut, signals may be provided to all over the data line 242 through the blocking pattern 256. The blocking pattern 256 may function as a repair line.

The array substrate according to the third embodiment may be manufactured through the same processes as those according to the first embodiment, except for the blocking pattern and the data contact holes. That is, the data contact holes are formed through the same process as a drain contact hole, and the blocking pattern is formed through the same process as the pixel electrodes and the common electrodes.

The blocking patterns may be formed under the second semiconductor layer and over the second semiconductor layer, respectively.

Figure 10A:
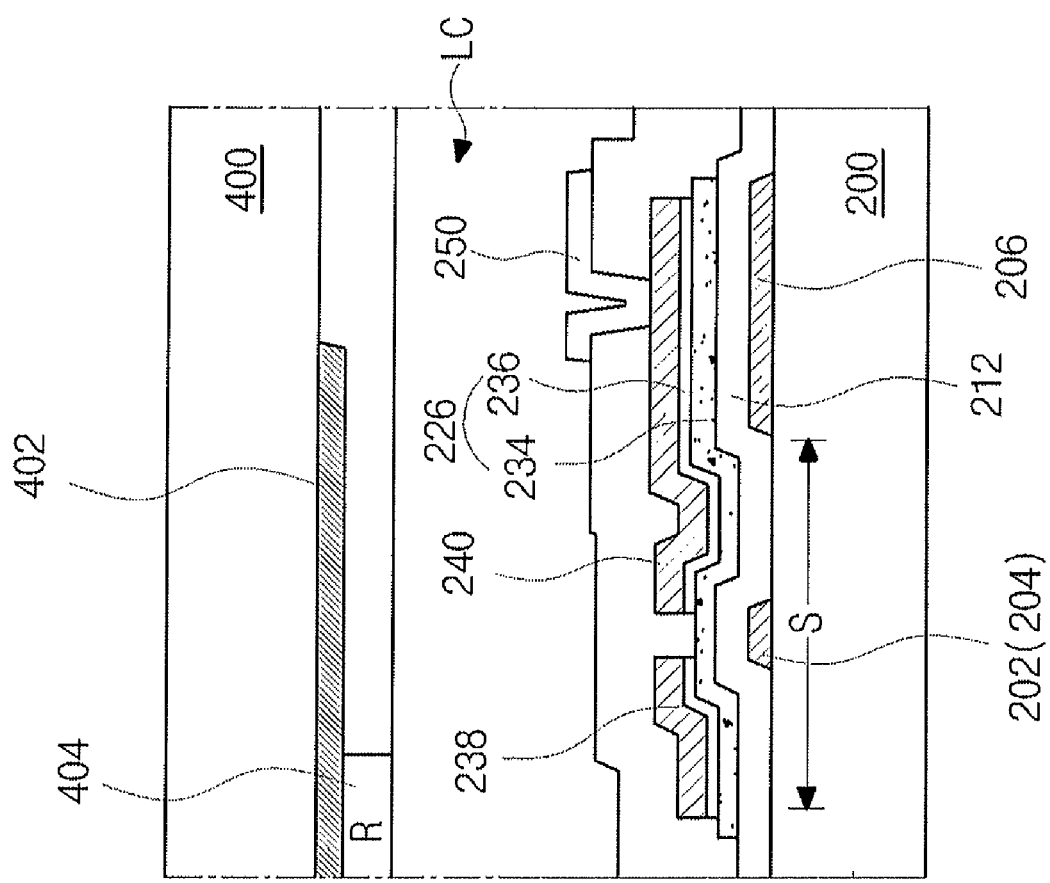
FIGS. 10A and 10B are cross-sectional views of an IPS mode LCD device according to a fourth embodiment.
Figure 10B:
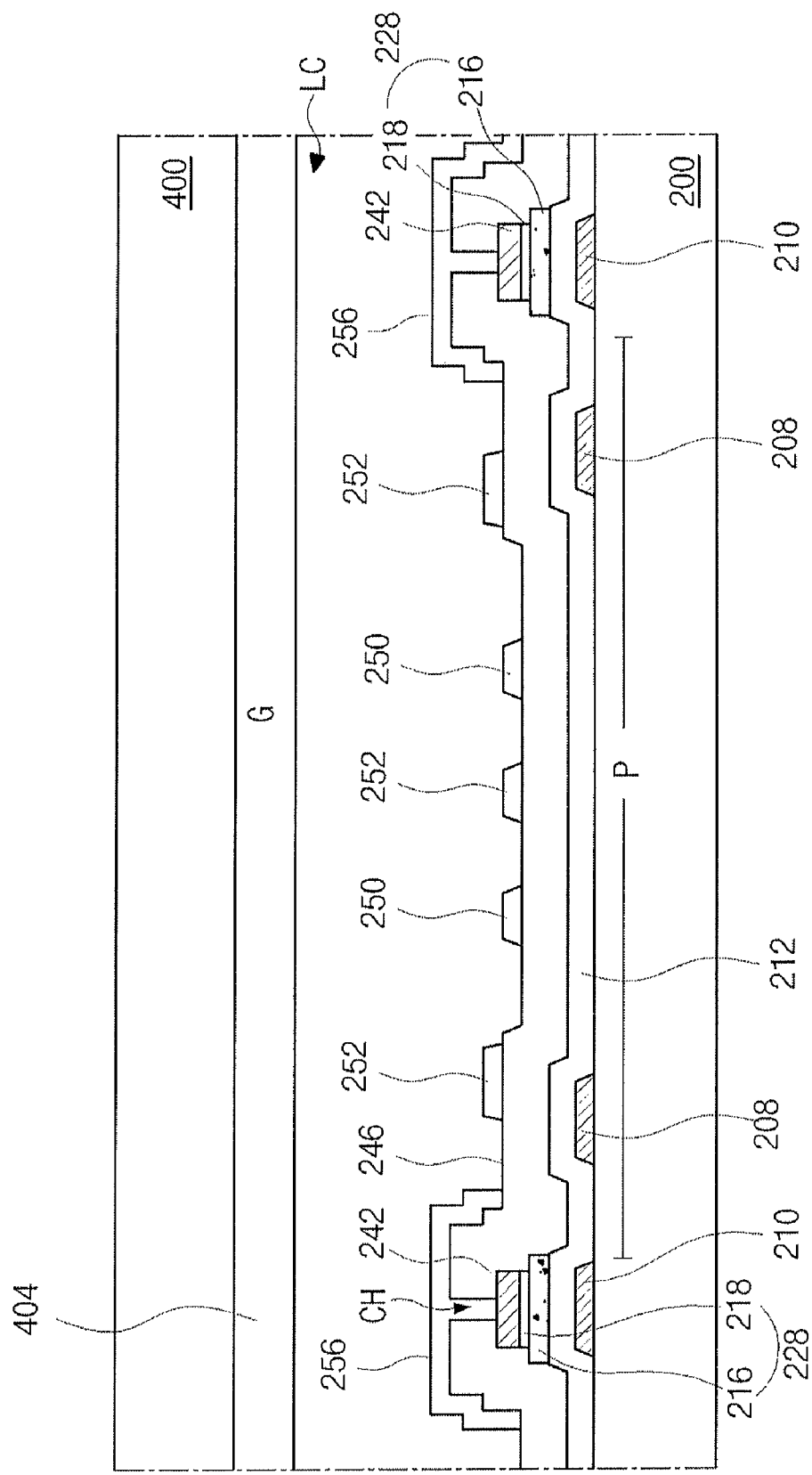

FIGS. 10A and 10B are cross-sectional views of an IPS mode LCD device according to a fourth embodiment.

In FIGS. 10A and 10B, the IPS mode LCD device includes a first substrate 200, a second substrate 400, and a liquid crystal layer LC interposed between the first and second substrates 200 and 400. The first and second substrates 200 and 400 may be transparent.

Common electrodes 252, pixel electrodes 250, common patterns 208 and a thin film transistor T are formed on the first substrate 200. The common electrodes 252 and the pixel electrodes 250 are disposed in a pixel region P and are substantially transparent. Each of the common electrodes 252 and the pixel electrodes 250 may have a rod shape. The common electrodes 252 alternate with the pixel electrodes 250. The thin film transistor T is disposed in a switching region S. The common patterns 208 are formed along peripheries of the pixel region P. The thin film transistor T includes a gate electrode 202, a gate insulating layer 212, a first semiconductor layer 226, a source electrode 238 and a drain electrode 240. The first semiconductor layer 226 is composed of an active layer 234 and an ohmic contact layer 236.

A data line 242 is formed along a side of the pixel region P. A second semiconductor layer 228 is formed under the data line 242. The second semiconductor layer 228 extends from the first semiconductor layer 226 and includes an intrinsic amorphous silicon layer 216 and an impurity-doped amorphous silicon layer 218. The intrinsic amorphous silicon layer 216 of the second semiconductor layer 228 is exposed at both sides of the data line 242.

A gate line 204 is further formed on the first substrate 200. A part of the gate line 204 functions as the gate electrode 202. Although not shown in the figure, the gate line 204 crosses the data line 242 to define the pixel region P. A common line 206 is spaced apart from the gate line 204 on the first substrate 200.

A first blocking pattern 210 is formed under the data line 242, and a second blocking pattern 256 is formed over the data line 242. The first blocking pattern 210 may be formed of the same material and in the same layer as the gate line 204, the common line 206, and the common pattern 208. The second blocking pattern 256 may be formed of the same material and in the same layer as the common electrodes 252 and the pixel electrodes 250. The second blocking pattern 256 randomly contacts the data line 242 through data contact holes CH in the passivation layer 246. The second blocking pattern 256 has a wider width than the second semiconductor layer 228 and covers the second semiconductor layer 228. The first blocking pattern 210 may have a narrower width than the second semiconductor layer 228, or the first blocking pattern 210 may have the same width as or a wider width than the second semiconductor layer 228.

However, since the second blocking pattern 256 is formed over the data line 242, it is preferred to form the first blocking pattern 210 having a narrower width than the second semiconductor layer 228. More particularly, the first blocking pattern 210, the second semiconductor layer 228 and the data line 242 may be misaligned, and one side of the second semiconductor layer 228 may deviate more from the first blocking pattern 210 than the other side. A coupling capacitance may be generated between the second semiconductor layer 228 and the common electrodes 252 or between the second semiconductor layer 228 and the pixel electrodes 250; however, the coupling capacitance may be shielded by the second blocking pattern 256. Thus, wavy noise may be prevented.

Meanwhile, the second blocking pattern 256 contacts the data line 242. Although the data line 242 may be broken, signals can be provided to the data line 242 through the second blocking pattern 256. The second blocking pattern 256 may function as a repair line.

A black matrix 402 and a color filter layer 404 are formed on an inner surface of the second substrate 400. The black matrix 402 is disposed over the gate line 204, the data line 242 and the thin film transistor T. The color filter layer 404 is disposed at the pixel region P.

The array substrate according to the fourth embodiment may be manufactured through the same processes as those according to the first embodiment, except for the data contact holes and the second blocking pattern. That is, the data contact holes CH partially exposing the data line 242 are formed through the third mask process for forming the drain contact hole. The second blocking pattern 256 is formed over the data line 242 through the fourth mask process for forming the common electrodes 252 and the pixel electrodes 250.

In the present invention, when a semiconductor layer is formed under a data line and is exposed at both sides of the data line, a blocking pattern is formed under the semiconductor layer or over the data line. The blocking pattern prevents light from going into the semiconductor layer or shields an electric field from the semiconductor layer. Wavy noise may be prevented, and an LCD device having a high quality may be provided.

The blocking pattern formed over the data line may be connected to the data line and may act as a repair line if the data line is cut. This may decrease the number of defective products and increase production yields.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

The invention claimed is:

1. An array substrate for an in-plane switching mode liquid crystal display
device, comprising: a substrate;
a gate line disposed on the substrate;
a data line crossing the gate line to define a pixel region;
a thin film transistor connected to the gate line and the data line;
pixel electrodes disposed in the pixel region and connected to the thin film transistor;
common electrodes disposed in the pixel region and alternating with the pixel electrodes;

a semiconductor layer disposed under the data line and including a portion having a width greater than a width of the data line; and a first blocking pattern over the data line and substantially covering the semiconductor layer.

2. The array substrate according to claim 1, wherein the first blocking pattern contacts the data line.

3. The array substrate according to claim 1, further comprising a second blocking pattern under the semiconductor layer, wherein the second blocking pattern is formed of a same material and in a same layer as the gate line.

4. An in-plane switching mode liquid crystal display device, comprising: first and second substrates spaced apart from each other;

a liquid crystal material disposed between the first and second substrates; a gate line on an inner surface of the first substrate;

a data line crossing the gate line to define a pixel region;

a thin film transistor connected to the gate line and the data line;

pixel electrodes in the pixel region and connected to the thin film transistor; common electrodes in the pixel region and alternating with the pixel electrodes;

a semiconductor layer under the data line and including a portion having a width greater than a width of the data line;

a first blocking pattern comprising an opaque material and disposed under the semiconductor layer;

a second blocking pattern disposed over the data line and substantially covering the semiconductor layer;

a black matrix on an inner surface of the second substrate; and a color filter layer on the inner surface of the second substrate.

5. The in-plane switching mode liquid crystal display device of claim 4, wherein the second blocking pattern contacts the data line.

* * * * *